(12) United States Patent
Otani et al.

(10) Patent No.: US 11,769,775 B2
(45) Date of Patent: *Sep. 26, 2023

(54) DISTANCE-MEASURING IMAGING DEVICE, DISTANCE MEASURING METHOD OF DISTANCE-MEASURING IMAGING DEVICE, AND SOLID-STATE IMAGING DEVICE

(71) Applicant: Panasonic Semiconductor Solutions Co., Ltd., Kyoto (JP)

(72) Inventors: Mitsuhiko Otani, Hyogo (JP); Junichi Matsuo, Osaka (JP); Haruka Takano, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 351 days.

This patent is subject to a terminal disclaimer.

(21) Appl. No.: 17/133,617

(22) Filed: Dec. 23, 2020

(65) Prior Publication Data

US 2021/0118926 A1    Apr. 22, 2021

Related U.S. Application Data

(63) Continuation of application No. 15/801,111, filed on Nov. 1, 2017, now Pat. No. 10,903,254, which is a (Continued)

(30) Foreign Application Priority Data

May 28, 2015   (JP) ................................ 2015-108867

(51) Int. Cl.
G01C 3/08    (2006.01)
H01L 27/146  (2006.01)
(Continued)

(52) U.S. Cl.
CPC .......... *H01L 27/14609* (2013.01); *G01C 3/06* (2013.01); *G01S 7/4863* (2013.01);
(Continued)

(58) Field of Classification Search
None
See application file for complete search history.

(56) References Cited

U.S. PATENT DOCUMENTS 7,436,496 B2   10/2008 Kawahito
8,319,166 B2   11/2012 Kawahito
(Continued)

FOREIGN PATENT DOCUMENTS

JP   2004-294420 A   10/2004
JP   2008-249673 A   10/2008
(Continued)

OTHER PUBLICATIONS

International Search Report issued in corresponding International Application No. PCT/JP2016/002297, dated Jul. 15, 2017 with English Translation.
(Continued)

*Primary Examiner* — Mark Hellner
(74) *Attorney, Agent, or Firm* — McDermott Will & Emery LLP

(57) ABSTRACT

A distance-measuring imaging device includes a light source that applies light according to timing of a light emission signal; a solid-state imager that performs, for an object, exposure according to timing of an exposure signal, and generates raw data corresponding to an exposure amount of the exposure; a signal amount comparator that determines a magnitude relationship in signal amount in the raw data; and a distance calculator that generates and outputs a distance signal based on a determination result. The solid-state imager accumulates, in each of different signal accumulation
(Continued)

regions for accumulating signals detected in a same pixel, a signal by exposure in an exposure period that differs in exposure signal timing. The signal amount comparator determines the magnitude relationship between the signals accumulated in the signal accumulation regions. The distance calculator calculates the distance to the object using an arithmetic expression selected depending on the determination result.

13 Claims, 14 Drawing Sheets

Related U.S. Application Data continuation of application No. PCT/JP2016/002297, filed on May 10, 2016.

(51) Int. Cl.
*G01S 17/10* (2020.01)
*G01S 7/487* (2006.01)
*G01S 17/894* (2020.01)
*G01S 17/89* (2020.01)
*H04N 25/00* (2023.01)
*H04N 25/40* (2023.01)
*G01C 3/06* (2006.01)
*G01S 7/4863* (2020.01)
*H01L 31/101* (2006.01)

(52) U.S. Cl.
CPC ............ *G01S 7/4876* (2013.01); *G01S 17/10* (2013.01); *G01S 17/89* (2013.01); *G01S 17/894* (2020.01); *H01L 27/14641* (2013.01); *H01L 31/101* (2013.01); *H04N 25/00* (2023.01); *H04N 25/40* (2023.01)

(56) References Cited

U.S. PATENT DOCUMENTS

| | | | |
|---|---|---|---|
| 8,976,340 B2 | 3/2015 | Gilliland et al. | |
| 9,418,425 B2 | 8/2016 | Park et al. | |
| 9,823,339 B2 | 11/2017 | Cohen | |
| 10,903,254 B2* | 1/2021 | Otani | H04N 25/40 |
| 2006/0192338 A1 | 8/2006 | Kawahito | |
| 2006/0192938 A1* | 8/2006 | Kawahito | G01S 7/4863 356/5.03 |
| 2012/0249781 A1 | 10/2012 | Vollmerhausen | |
| 2015/0301177 A1 | 10/2015 | Tsukamoto et al. | |
| 2015/0301180 A1 | 10/2015 | Stettner et al. | |
| 2015/0362586 A1 | 12/2015 | Heinrich | |
| 2017/0115393 A1* | 4/2017 | Nagai | G01S 17/10 |

FOREIGN PATENT DOCUMENTS

| | | | |
|---|---|---|---|
| JP | 2013-076645 A | 4/2013 | |
| JP | 2015-49146 A | 3/2015 | |
| JP | 2015-49148 A | 3/2015 | |

OTHER PUBLICATIONS

Non-Final Office Action issued in U.S. Appl. No. 15/801,111, dated Oct. 18, 2019.
Notice of Allowance issued in U.S. Appl. No. 15/801,111, dated Sep. 24, 2020.
Notice of Allowance issued in U.S. Appl. No. 15/801,111, dated Sep. 24, 2019.
International Search Report Issued in corresponding International Application No. PCT/JP2016/002297, dated Aug. 2, 2016, with English Translation.

* cited by examiner

DISTANCE-MEASURING IMAGING DEVICE, DISTANCE MEASURING METHOD OF DISTANCE-MEASURING IMAGING DEVICE, AND SOLID-STATE IMAGING DEVICE

CROSS REFERENCE TO RELATED APPLICATIONS

This application is a U.S. continuation application Ser. No. 15/801,111 filed Nov. 1, 2017, which is a U.S. continuation application of PCT International Patent Application Number PCT/JP2016/002297 filed on May 10, 2016, claiming the benefit of priority of Japanese Patent Application Number 2015-108867 filed on May 28, 2015, the entire contents of which are hereby incorporated by reference.

BACKGROUND

1. Technical Field

The present disclosure relates to a distance-measuring imaging device, a distance measuring method of the distance-measuring imaging device, and a solid-state imaging device.

2. Description of the Related Art

Of a plurality of methods for detecting an object, a time of flight (TOF) method of measuring a distance using a time of flight during which light travels to and from a measurement object is known.

Japanese Unexamined Patent Application Publication No. 2004-294420 (Patent Literature (PTL) 1) discloses the following conventional technique: Charges are transferred to two different signal accumulators with different phases from each other in sync with intermittent operation of light from a light source, to perform signal accumulation. The distance to an object is calculated from the accumulation signal distribution ratio. Further, signal accumulation for background light alone is performed in a third signal accumulator to remove background light, thus eliminating the influence of background light.

SUMMARY

With the conventional technique disclosed in PTL 1, the third signal accumulator is used exclusively for background light. Distance measurement range (limit) D depends on the pulse width (To) of the light source, and is expressed as follows, where c denotes the speed of light (299,792,458 m/s).

$$D = c \times To/2.$$

When the pulse width (To) of the light source is greater, distance measurement range D is wider, but the distance resolution is lower. The distance measurement accuracy is thus inversely proportional to the pulse width (To) of the light source. In other words, increasing the pulse width (To) of the light source to widen distance measurement range (limit) D causes a decrease in distance measurement accuracy.

The conventional technique therefore has difficulty in achieving both a wide distance measurement range and high distance measurement accuracy.

The present disclosure has an object of providing a distance-measuring imaging device, a distance measuring method of the distance-measuring imaging device, and a solid-state imaging device for achieving high distance measurement accuracy and a wide distance measurement range.

A distance-measuring imaging device according to one aspect of the present disclosure includes: a light source that applies irradiation light a plurality of times according to timing indicated by a light emission signal; a solid-state imager that includes a solid-state imaging element that performs, for an area including an object, exposure to light a plurality of times according to timing indicated by an exposure signal, and generates a signal corresponding to a total exposure amount of the exposure, the solid-state imaging element including a plurality of signal accumulation regions for accumulating signal charges detected in a same pixel, and each of the plurality of signal accumulation regions not being used exclusively to accumulate a signal charge by exposure to reflected light from the object involving only background light different from the irradiation light, but being used to accumulate a signal charge by exposure according to the exposure signal that differs in timing with respect to the light emission signal; a signal amount comparator that determines a magnitude relationship in signal amount based on the signal charges accumulated in the plurality of signal accumulation regions; and a distance calculator that calculates a distance to the object, based on a result of the determination of the magnitude relationship in signal amount.

The distance-measuring imaging device according to one aspect of the present disclosure can ensure high distance measurement accuracy and widen the distance measurement range to at least one of the farther side and the closer side, without increasing the pulse width of the light source.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

The following describes a distance-measuring imaging device according to embodiments of the present disclosure with reference to drawings. The embodiments described below each show a specific example of the present disclosure. The numerical values, shapes, materials, structural elements, the arrangement and connection of the structural elements, etc. shown in the following embodiments are mere examples, and do not limit the scope of the present disclosure.

Embodiment 1

Figure 1:
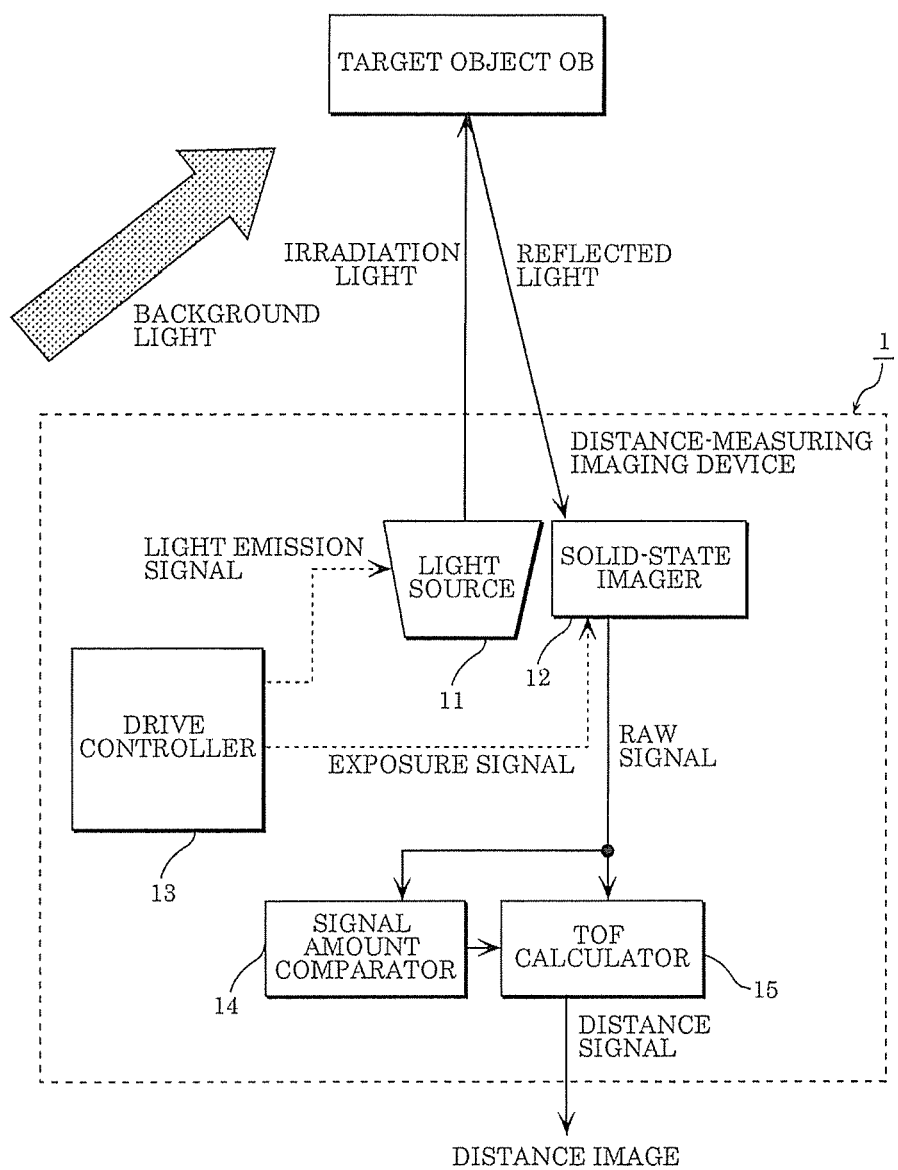
FIG. 1 is a functional block diagram illustrating an example of the schematic structure of a distance-measuring imaging device according to Embodiment 1.

FIG. 1 is a functional block diagram illustrating an example of the schematic structure of distance-measuring imaging device 1 according to Embodiment 1. As illustrated in FIG. 1, distance-measuring imaging device 1 includes light source 11, solid-state imager 12, drive controller 13, signal amount comparator 14, and TOF calculator 15 (distance calculator 15).

Light source 11 includes a drive circuit, a capacitor, and a light-emitting element, and emits light by supplying a charge held in the capacitor to the light-emitting element. The light-emitting element may be a laser diode, a light-emitting diode (LED), or the like.

Drive controller 13 generates a light emission signal for instructing light application to a measurement object (object OB), and an exposure signal for instructing exposure to reflected light from object OB.

Light source 11 applies light to object OB according to the timing of receiving the light emission signal generated by drive controller 13.

Solid-state imager 12 performs, for an area including object OB, exposure to light a plurality of times according to the timing indicated by the exposure signal generated by drive controller 13, and obtains raw data (imaging information) corresponding to the total exposure amount of the exposure performed the plurality of times. Solid-state imager 12 includes a camera lens, a solid-state imaging element, and a circuit such as an A/D converter for generating and outputting raw data.

Signal amount comparator 14 at least determines a magnitude relationship in signal amount of the raw data received from solid-state imager 12, and notifies a determination result to TOF calculator 15 (distance calculator 15).

TOF calculator 15 (distance calculator 15) calculates and outputs a TOF signal (distance signal), i.e. information of the distance to object OB, depending on the determination result of signal amount comparator 14, based on the raw data received from solid-state imager 12 or a signal received from signal amount comparator 14. The signal received from signal amount comparator 14 is based on the raw data output from solid-state imager 12.

Solid-state imager 12 in distance-measuring imaging device 1 according to this embodiment is described below, using a charge coupled device (CCD) solid-state imaging element as an example.

Figure 2:
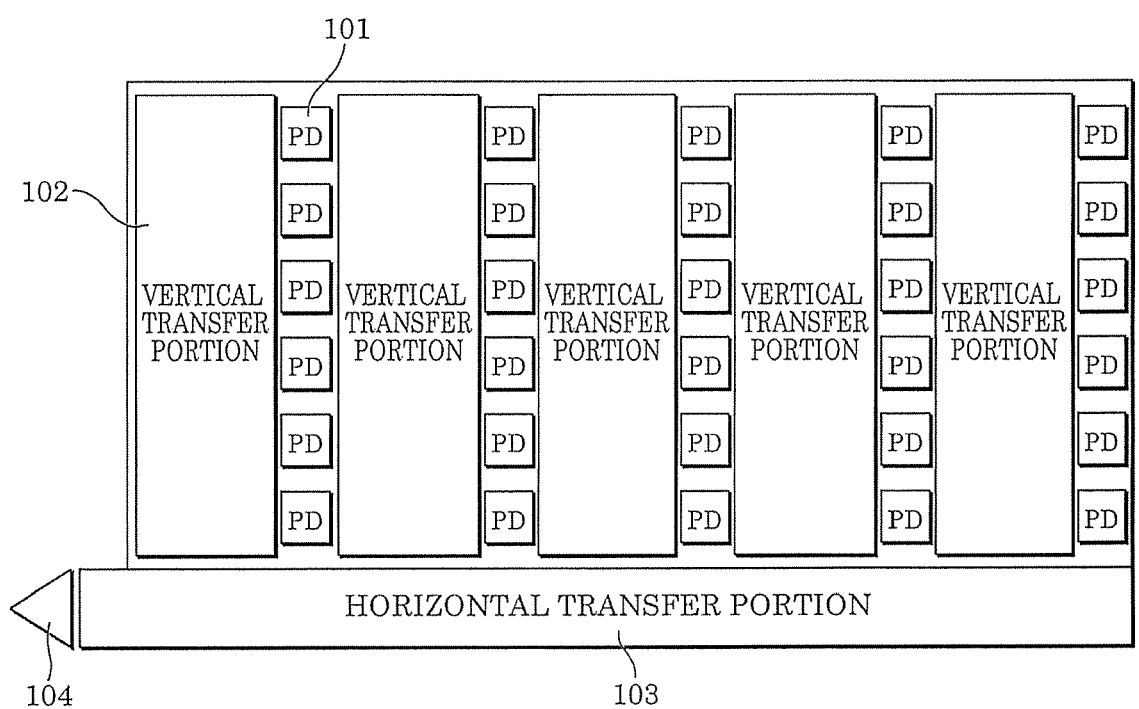
FIG. 2 is a schematic diagram illustrating an example of the functions of a CCD solid-state imaging element.

FIG. 2 is a schematic diagram illustrating the functions of a CCD solid-state imaging element. As illustrated in FIG. 2, the CCD solid-state imaging element includes photodiode 101, vertical transfer portion 102, horizontal transfer portion 103, and signal charge detector 104.

Photodiode 101 converts received light into a charge.

Vertical transfer portion 102 includes a plurality of gates, and transfers charges read from photodiodes 101 sequentially in the vertical direction.

Horizontal transfer portion 103 includes a plurality of gates, and transfers charges received from vertical transfer portions 102 as packets, sequentially in the horizontal direction.

Signal charge detector 104 sequentially detects the charges received from the horizontal transfer portion, converts each charge into a voltage signal, and outputs the voltage signal.

Here, in a state where a readout gate is open, a substrate voltage is controlled according to an exposure signal, and photodiode 101 is exposed to light in a period during which the exposure signal is Low. A charge generated by this exposure is accumulated in vertical transfer portion 102.

Figure 3:
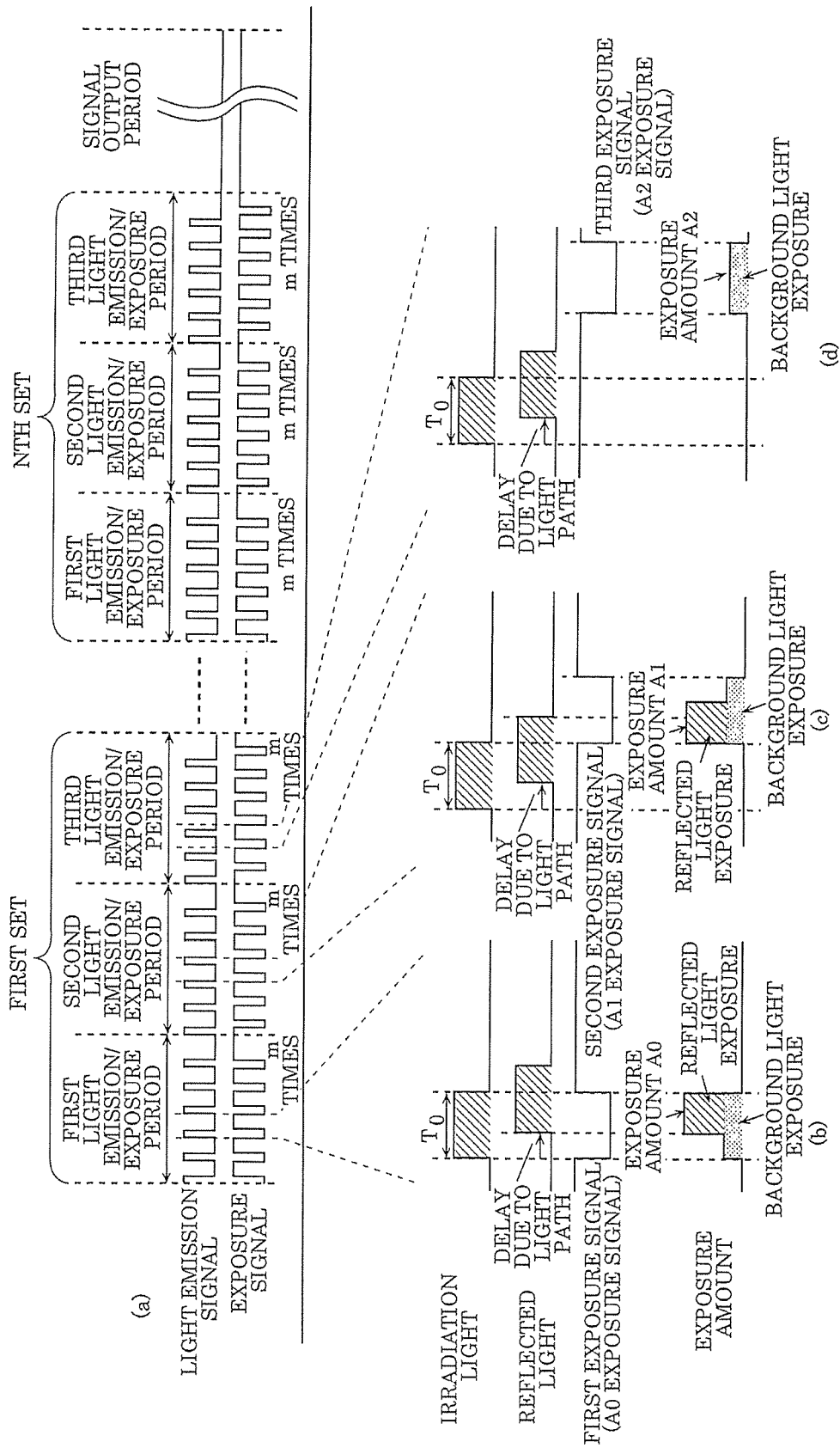
FIG. 3 is a diagram illustrating an example of exposure amount detection timing in the distance-measuring imaging device according to Embodiment 1.
Figure 5:
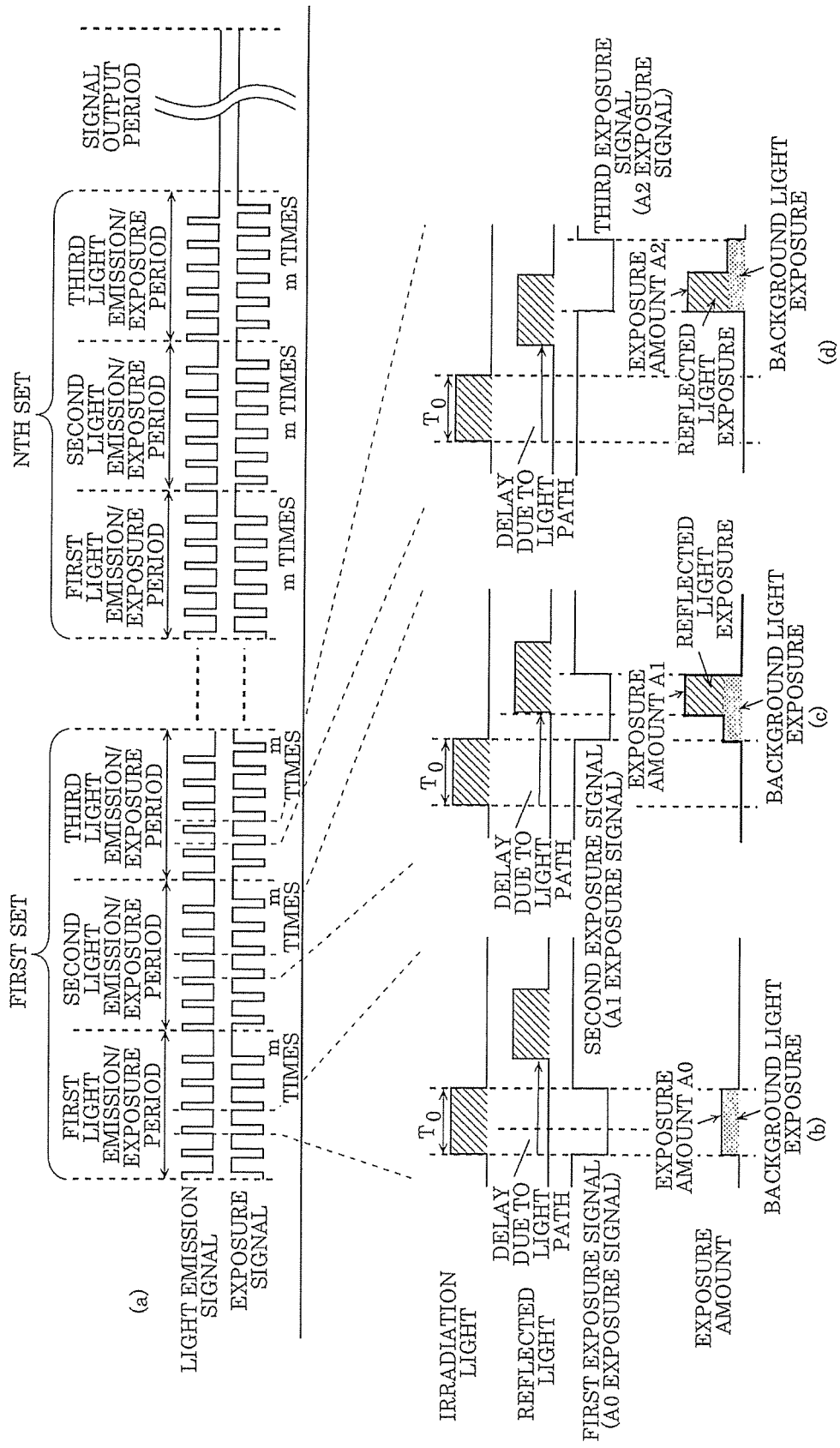
FIG. 5 is a diagram illustrating an example of exposure amount detection timing in the distance-measuring imaging device according to Embodiment 1.

FIGS. 3 and 5 are each a diagram illustrating an example of exposure amount detection timing in the distance-measuring imaging device according to Embodiment 1. This embodiment describes an example where the number of different signal accumulators for accumulating signals detected in the same pixel in solid-state imager 12 is 3.

(a) in FIG. 3 and (a) in FIG. 5 each illustrate an example of the timing relationship in one screen in which drive controller 13 outputs the light emission signal and the exposure signal. (b) in FIG. 3 and (b) in FIG. 5 each illustrate the detection timing of exposure amount A0 in a first light emission/exposure period. (c) in FIG. 3 and (c) in FIG. 5 each illustrate the detection timing of exposure amount A1 in a second light emission/exposure period. (d) in FIG. 3 and (d) in FIG. 5 each illustrate the detection timing of exposure amount A2 in a third light emission/exposure period.

As illustrated in (a) and (b) in FIG. 3 and (a) and (b) in FIG. 5, in the first light emission/exposure period, photodiode 101 is exposed to light in a period during which a first exposure signal is Low, and a charge generated by the exposure is accumulated in vertical transfer portion 102. This operation is repeated m times in this embodiment. When the first light emission/exposure period ends, the gates of the vertical transfer portion 102 are controlled to transfer the charge to a packet with no readout gate.

The first light emission/exposure period is a period during which solid-state imager 12 receives the exposure signal and performs exposure after a first delay time with respect to the timing at which light source 11 receives the light emission signal and emits light. In this embodiment, the length of the first exposure signal period is set to To same as the length of the light emission signal period, and the first delay time is set to 0. Thus, the first exposure signal period is set to a period during which the light emission signal is transmitted (high level).

Next, as illustrated in (a) and (c) in FIG. 3 and (a) and (c) in FIG. 5, in the second light emission/exposure period, photodiode 101 is exposed to light in a period during which a second exposure signal is Low, and a charge generated by the exposure is accumulated in vertical transfer portion 102. This operation is repeated m times in this embodiment. When the second light emission/exposure period ends, the gates of the vertical transfer portion 102 are controlled to transfer the charge to a packet with no readout gate.

The second light emission/exposure period is a period during which solid-state imager 12 receives the exposure signal and performs exposure after a second delay time different from the first delay time with respect to the timing of receiving the light emission signal. In this embodiment, the length of the second exposure signal period is set to To same as the length of the light emission signal period and the length of the first exposure signal period, and the second delay time is set to To which is the sum of first delay time 0 and the first exposure signal period.

Next, as illustrated in (a) and (d) in FIG. 3 and (a) and (d) in FIG. 5, in the third light emission/exposure period, photodiode 101 is exposed to light in a period during which a third exposure signal is Low, and a charge generated by the exposure is accumulated in vertical transfer portion 102. This operation is repeated m times in this embodiment. When the third light emission/exposure period ends, the gates of the vertical transfer portion 102 are controlled to perform transfer so that the charge by the exposure according to the first exposure signal is situated in a packet with a readout gate.

The third light emission/exposure period is a period during which solid-state imager 12 receives the exposure signal and performs exposure after a third delay time different from the first and second delay times with respect to the timing of receiving the light emission signal. In this embodiment, the length of the third exposure signal period is set to To same as the length of the light emission signal period and the length of each of the first and second exposure signal periods, and the third delay time is set to 2×To which is the sum of first delay time 0, first exposure signal period To, and second exposure period To.

This series of operations is repeatedly performed N times in this embodiment. After this, the transfer of vertical transfer portion 102 and the transfer of horizontal transfer portion 103 are repeatedly performed sequentially, and the charge is converted into a voltage signal in signal charge detector 104 and output.

In this way, a plurality of packets already provided in vertical transfer portion 102 can be used as accumulators of signals obtained in a plurality of exposure periods that differ in the timing of the exposure signal for receiving reflected light from object OB with respect to the light emission signal. This makes it unnecessary to newly form signal accumulators. Photodiode 101 can be made larger with the same area, with it being possible to increase saturation sensitivity and increase the maximum light reception amount. Highly accurate distance measurement can thus be achieved.

In FIG. 2, the use of a CCD image sensor (CCD solid-state imaging element) enables a global reset, i.e. an operation of resetting the plurality of photodiodes 101 at once. More accurate distance measurement can be achieved in this way. The solid-state imaging element used in this embodiment is, however, not limited to a CCD image sensor. The same advantageous effects (e.g. distance measurement accuracy improvement by S/N improvement) can be achieved even when any other solid-state imaging element (image sensor) such as a CMOS image sensor (CMOS solid-state imaging element) is used in view of other requirements of a distance-measuring imaging device.

The distance measuring operation by the distance-measuring imaging device according to this embodiment is described in detail below, with reference to FIGS. 3 to 6.

Figure 4:
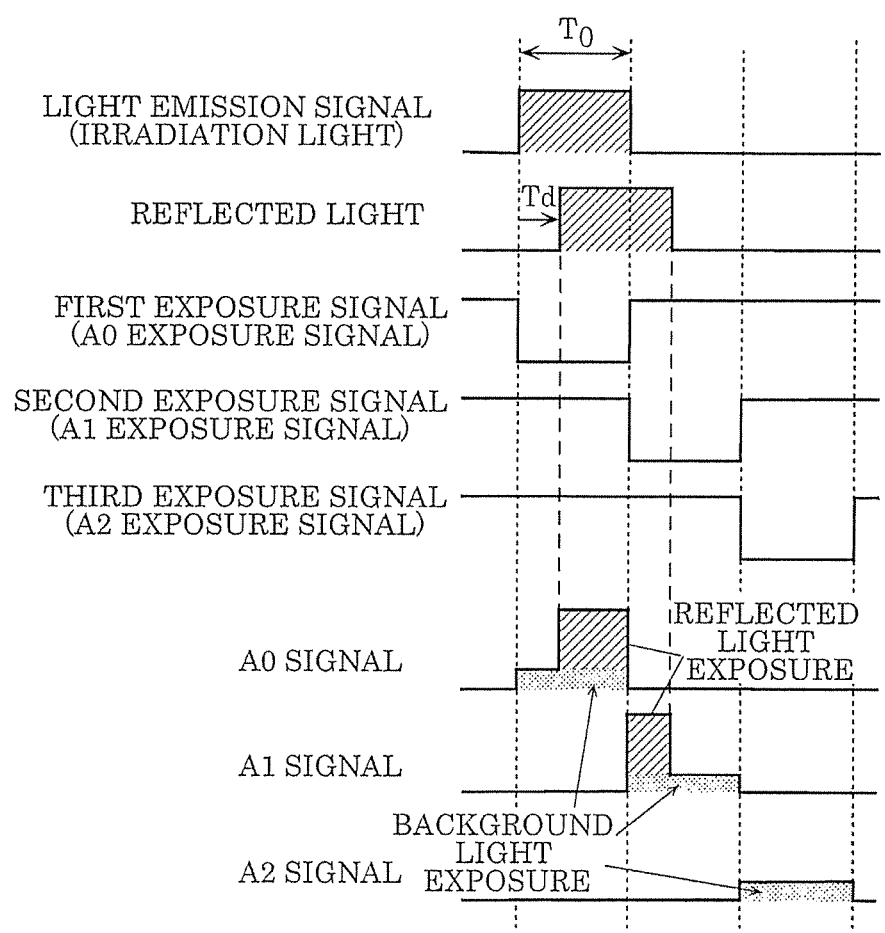
FIG. 4 is a timing chart of a light emission signal and an exposure signal in the distance-measuring imaging device according to Embodiment 1.
Figure 6:
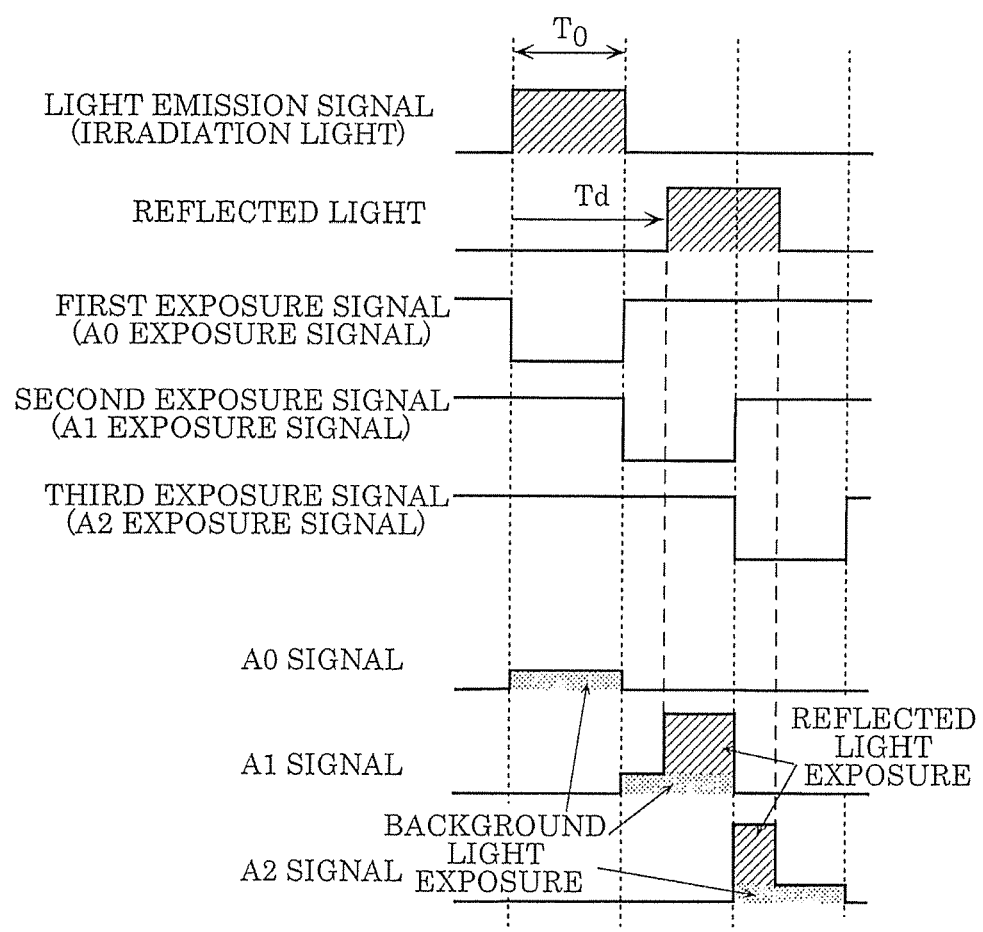
FIG. 6 is a timing chart of a light emission signal and an exposure signal in the distance-measuring imaging device according to Embodiment 1.

FIGS. 4 and 6 are each a timing chart of the light emission signal and the exposure signal in the distance-measuring imaging device according to Embodiment 1. (b), (c), and (d) in FIG. 3, FIG. 4, (b), (c), and (d) in FIG. 5, and FIG. 6 are diagrams illustrating the detailed operation of distance-measuring imaging device 1 according to Embodiment 1. In more detail, the drawings illustrate an example of the timing relationship between the light emission signal and the exposure signal generated by drive controller 13. In particular, FIGS. 4 and 6 each illustrate the timings of the light emission signal and exposure signal on the same paper surface, to ease the understanding of the relationship between a plurality of exposure periods that differ in the timing of the exposure signal for receiving reflected light. This embodiment describes an example where the number of different signal accumulators for accumulating signals detected in the same pixel in solid-state imager 12 is 3.

First, drive controller 13 outputs the first, second, and third exposure signals that differ in the timing at which solid-state imager 12 receives reflected light from object OB with respect to the light emission signal. In this embodiment, the length of each of the first, second, and third exposure signal periods is set to To same as the length of the light emission signal period, and the delay time of the first exposure signal with respect to the timing at which light source 11 receives the light emission signal and emits light is set to 0. Thus, the first exposure signal period is set to a period during which the light emission signal is transmitted (high level). The delay time of the second exposure signal is set to To which is the sum of first delay time 0 and first exposure signal period To. The delay time of the third exposure signal is set to 2×To which is the sum of second delay time To and second exposure period To. Accordingly, the exposure amount of background light is equal in the first, second, and third exposure signal periods.

(a) in FIG. 3 and (a) in FIG. 5 each illustrate an example of the timing relationship of the light emission signal and the first, second, and third exposure signals in one screen. In this embodiment, the number of repetitions of the light emission signal and the exposure signal in each of the first, second, and third light emission/exposure periods is m, with this series of timings being regarded as one set. This set is repeatedly output N times, and then the accumulated exposure signals are output. Let A0 be the total sum of exposure amounts a0 according to the first exposure signal, A1 be the total sum of exposure amounts a1 according to the second exposure signal, and A2 be the total sum of exposure amounts a2 according to the third exposure signal.

FIGS. 3 and 4 illustrate the case where delay Td due to the light path of reflected light from object OB with respect to the light emission signal timing (irradiation light) is less than the sum of first delay time 0 and first exposure signal period To (i.e. To). In this case, exposure is performed so as to include all reflected light from object OB in the period that adds the first exposure signal period and the second exposure signal period together. The exposure amount in the second exposure signal period is greater when delay Td of the reflected light from object OB with respect to the light emission signal timing is greater. In the third exposure signal period, exposure to only background light is performed.

In this case, signal amount comparator 14 compares total exposure amount A0 according to the first exposure signal and total exposure amount A2 according to the third exposure signal, and determines as indicated in the following Expression 1.

[Math. 1]

$$A0 > A2 \tag{Expression 1}$$

Signal amount comparator 14 notifies the determination result of Expression 1 to TOF calculator 15.

Let c be the speed of light (299,792,458 m/s). TOF calculator 15 can calculate distance L according to the following Expression 2.

[Math. 2]

$$L = \frac{c \times To}{2} \times \frac{A1 - A2}{A0 - A2 + A1 - A2}. \tag{Expression 2}$$

FIGS. 5 and 6 illustrate the case where delay Td due to the light path of reflected light from object OB with respect to the light emission signal timing (irradiation light) is greater than or equal to the sum of first delay time 0 and first exposure signal period To (i.e. To). In this case, exposure is performed so as to include all reflected light from object OB in the period that adds the second exposure signal period and the third exposure signal period together. The exposure amount in the third exposure signal period is greater when delay Td of the reflected light from object OB with respect to the light emission signal timing is greater. In the first exposure signal period, exposure to only background light is performed.

In this case, signal amount comparator 14 compares total exposure amount A0 according to the first exposure signal and total exposure amount A2 according to the third exposure signal, and determines as indicated in the following Expression 3.

[Math. 3]

$$A2 \geq A0 \tag{Expression 3}$$

Signal amount comparator 14 notifies the determination result of Expression 3 to TOF calculator 15. TOF calculator 15 can calculate distance L according to the following Expression 4.

[Math. 4]

$$L = \frac{c \times To}{2} \times \frac{A2 - A0}{A1 - A0 + A2 - A0} + \frac{c \times To}{2}. \tag{Expression 4}$$

As described above, all of a plurality of different signal accumulators are used to accumulate signals corresponding to exposure in exposure periods that differ in the exposure signal timing. Here, "exposure period" is a period of exposure to reflected light from object OB with respect to the light emission signal timing. By changing the expression for TOF calculation depending on the result of comparing the magnitude relationship in signal amount between the plurality of different signal accumulators, the exposure period is increased while removing background light. Moreover, the distance measurement range (limit) is not limited to c×To/2, but widened twice to 2×(c×To/2). Hence, the distance measurement range can be widened to at least one of the farther side and the closer side by setting the first delay time, without increasing pulse width To of the light source.

A distance-measuring imaging device with high accuracy and a wide distance measurement range can thus be achieved.

(Variation of Embodiment 1)

Figure 7:
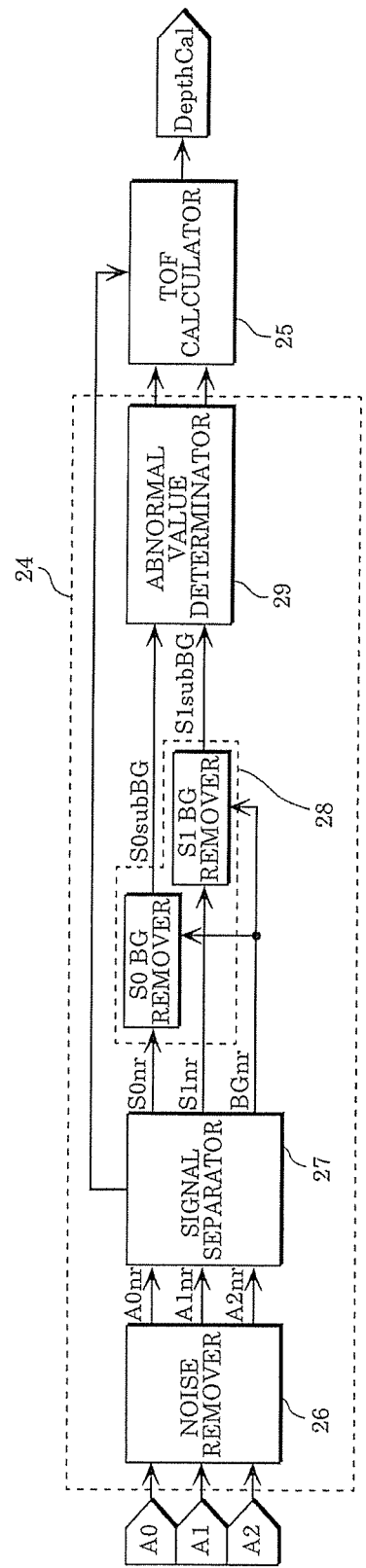
FIG. 7 is a functional block diagram illustrating an example of the schematic structure of a signal amount comparator in a distance-measuring imaging device according to a variation of Embodiment 1.

FIG. 7 is a functional block diagram illustrating an example of the schematic structure of a signal amount comparator in a distance-measuring imaging device according to a variation of Embodiment 1. As illustrated in FIG. 7, signal amount comparator 24 includes noise remover 26, signal separator 27, background light remover 28, and abnormal value determinator 29.

Noise remover 26 removes noise from raw data received from solid-state imager 12.

Signal separator 27 separates the plurality of signals involving reflected light and the signal involving only background light, from the magnitude relationship in signal amount between the signals accumulated in the plurality of different signal accumulators in the noise-removed raw data received from noise remover 26. Signal separator 27 notifies the determination result of the magnitude relationship in signal amount to TOF calculator 25 (distance calculator 25).

Background light remover 28 subtracts the signal involving only background light from the plurality of signals involving reflected light received from signal separator 27, to remove the background light signal.

Abnormal value determinator 29 determines an abnormal value from the plurality of background light-removed signals received from background light remover 28, and notifies the determination result to TOF calculator 25.

The timing relationship of the light emission signal and the exposure signal is described in detail below, using the same example as in the timing relationship illustrated in FIGS. 3 to 6.

Noise remover 26 removes noise from each of total exposure amount A0 according to the first exposure signal, total exposure amount A1 according to the second exposure signal, and total exposure amount A2 according to the third exposure signal in the raw data received from solid-state imager 12, and notifies the respective noise-removed exposure amounts to signal separator 27 as A0nr, A1nr, and A2nr.

In the case where delay Td due to the light path of reflected light from object OB with respect to the light emission signal timing (irradiation light) is less than the sum of first delay time 0 and the first exposure signal period (i.e. To), signal separator 27 determines as indicated in the following Expression 5.

[Math. 5]

$$A0nr > A2nr \tag{Expression 5}$$

Let S0nr be a signal with a smaller exposure amount when delay Td of reflected light from object OB with respect to the light emission signal timing is greater, S1nr be a signal with a greater exposure amount when delay Td of reflected light from object OB with respect to the light emission signal timing is greater, and BGnr be an exposure amount involving only background light. Then, signal separator 27 separates the signals as indicated in the following Expression 6, and notifies the result to background light remover 28.

[Math. 6]

$$S0nr = A0nr$$

$$S1nr = A1nr$$

$$BGnr = A2nr \tag{Expression 6}$$

Signal separator 27 further notifies a determination result J=0 to TOF calculator 25.

In the case where delay Td due to the light path of reflected light from object OB with respect to the light emission signal timing (irradiation light) is greater than or equal to the sum of first delay time 0 and the first exposure signal period (i.e. To), signal separator 27 determines as indicated in the following Expression 7, separates the signals as indicated in the following Expression 8, and notifies the result to background light remover 28.

[Math. 7]

$$A2nr \geq A0nr \quad \text{(Expression 7)}.$$

[Math. 8]

$$S0nr = A1nr$$

$$S1nr = A2nr$$

$$BGnr = A0nr \quad \text{(Expression 8)}.$$

Signal separator 27 further notifies a determination result J=1 to TOF calculator 25.

Background light remover 28 removes background light, performs a process according to the following Expression 9, and notifies the result to abnormal value determinator 29.

[Math. 9]

$$S0subBG = S0nr - BGnr$$

$$S1subBG = S1nr - BGnr \quad \text{(Expression 9)}.$$

Abnormal value determinator 29 determines the signal amounts of S0subBG and S1subBG received from background light remover 28. In the case where object OB is outside the measurement range, total exposure amount A0 according to the first exposure signal, total exposure amount A1 according to the second exposure signal, and total exposure amount A2 according to the third exposure signal are approximately the same. Here, in the case where the signal amounts of S0subBG and S1subBG are extremely close to 0, abnormal value determinator 29 determines an abnormal value outside the measurement range, and notifies the result to TOF calculator 25. Otherwise, abnormal value determinator 29 notifies S0subBG and S1subBG to TOF calculator 25.

TOF calculator 25 can calculate distance L according to the following Expression 10.

[Math. 10]

$$L = \frac{c \times To}{2} \times \frac{S1subBG}{S0subBG + S1subBG} + J \times \frac{c \times To}{2}. \quad \text{(Expression 10)}$$

In this way, the distance measurement range (limit) is not limited to c×To/2, but widened twice to 2×(c×To/2). Moreover, a determination error can be prevented by comparing the magnitude of signal amount between the signals from which noise has been removed. A distance-measuring imaging device with higher accuracy and a wide distance measurement range can thus be achieved.

Furthermore, the signal amounts of the plurality of signals from which background light has been removed are subjected to determination. Accordingly, in the case where the measurement object is outside the measurement range, the signal amounts of all of the plurality of signals from which background light has been removed are found to be close to 0. This eases the determination of whether or not the object is outside the distance measurement range. A distance-measuring imaging device with higher accuracy and a wide distance measurement range can thus be achieved.

Embodiment 2

Figure 8:
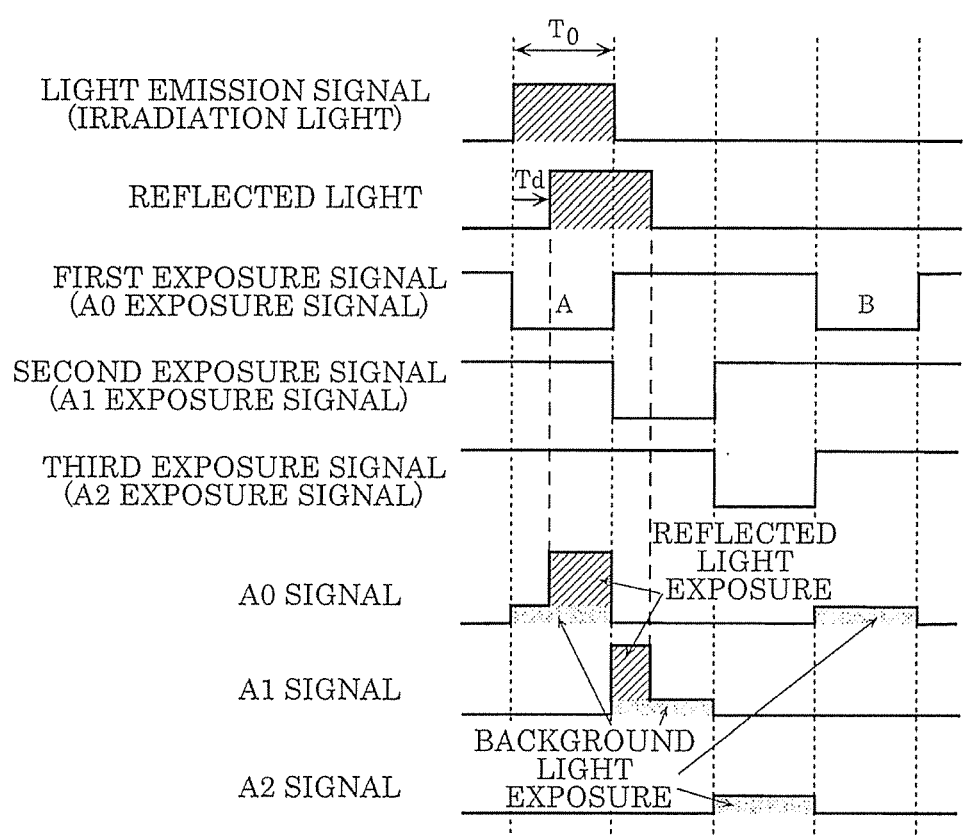
FIG. 8 is a timing chart of a light emission signal and an exposure signal in a distance-measuring imaging device according to Embodiment 2.
Figure 9:
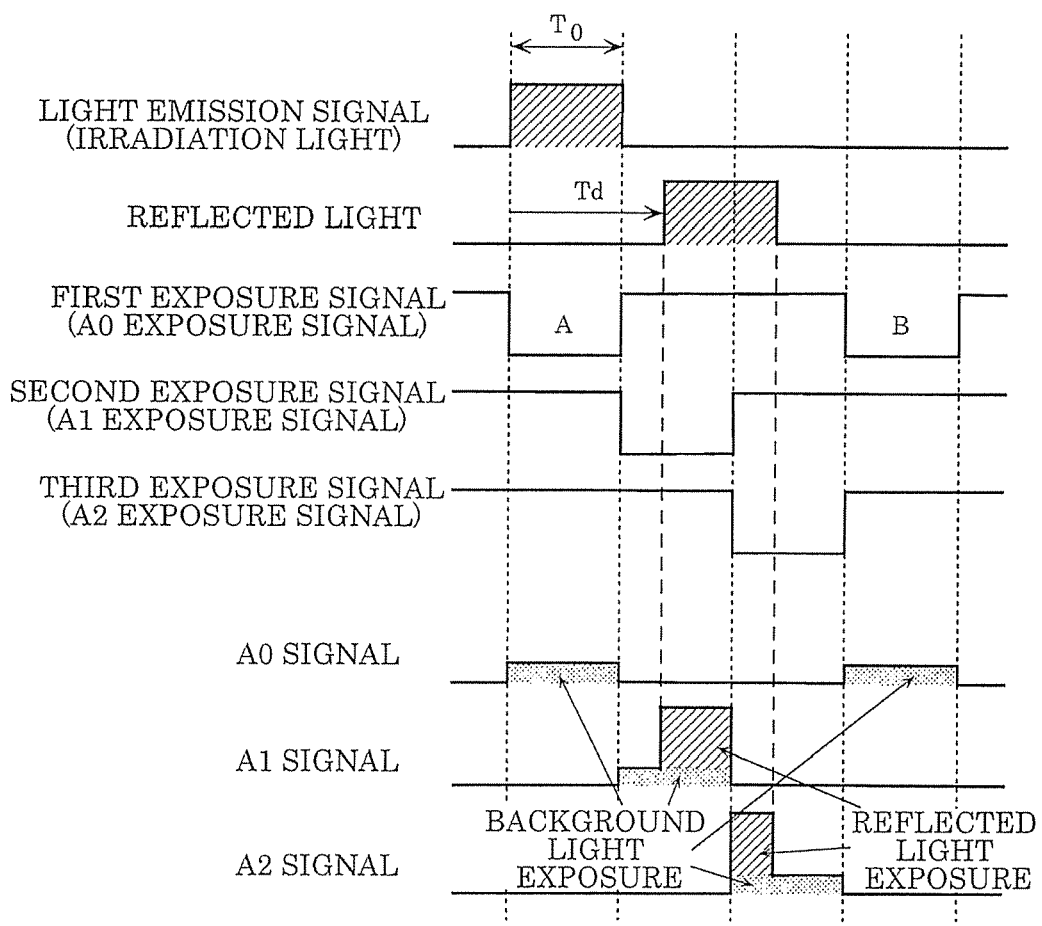
FIG. 9 is a timing chart of a light emission signal and an exposure signal in the distance-measuring imaging device according to Embodiment 2.
Figure 10:
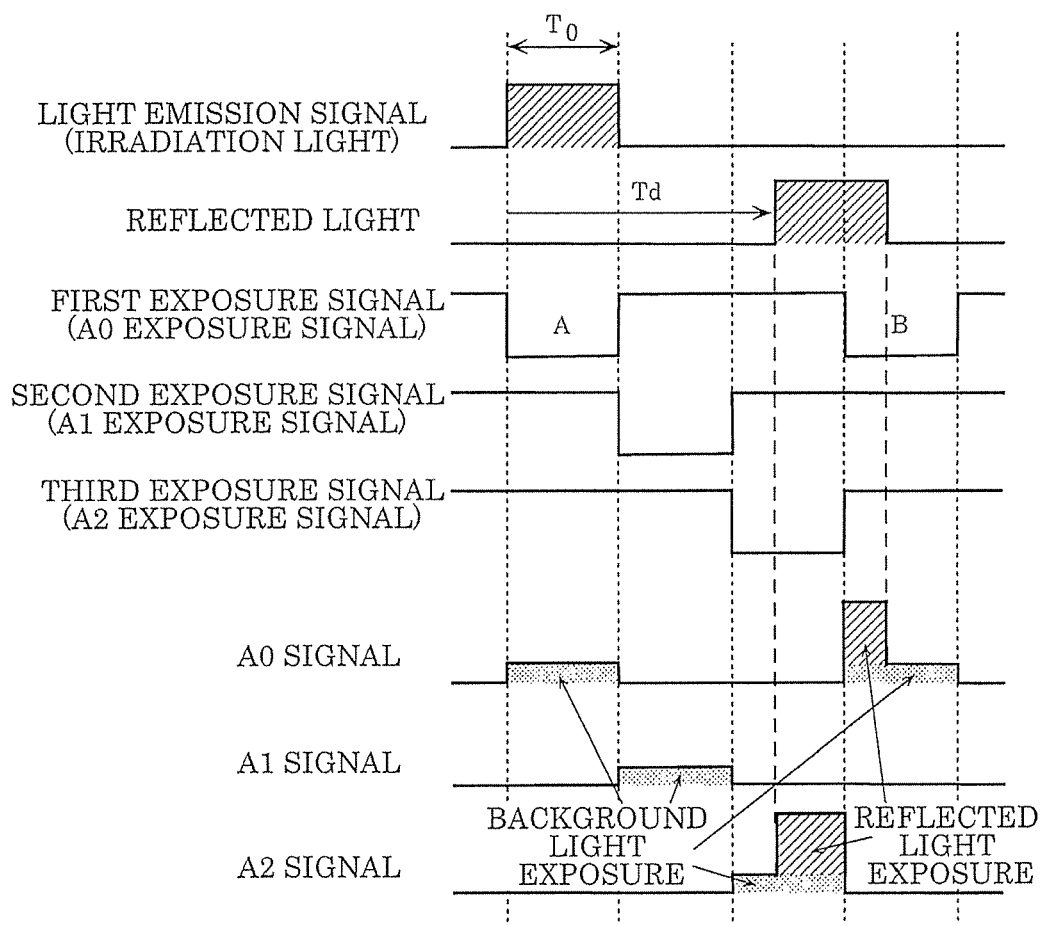
FIG. 10 is a timing chart of a light emission signal and an exposure signal in the distance-measuring imaging device according to Embodiment 2.

FIGS. 8, 9, and 10 are each a timing chart of the light emission signal and the exposure signal in distance-measuring imaging device 1 according to Embodiment 2. In detail, the drawings illustrate an example of the timing relationship between the light emission signal and the exposure signal generated by drive controller 13. In particular, the drawings each illustrate the timings of the light emission signal and exposure signal on the same paper surface, to ease the understanding of the relationship between a plurality of exposure periods that differ in the timing of the exposure signal for receiving reflected light. This embodiment describes an example where the number of different signal accumulators for accumulating signals detected in the same pixel in solid-state imager 12 is 3.

Drive controller 13 outputs the first, second, and third exposure signals that differ in the timing at which solid-state imager 12 receives reflected light from object OB with respect to the light emission signal.

In this embodiment, the length of the exposure signal period of the first exposure signal is set to To same as the length of the light emission signal period. The first exposure signal is composed of two exposure signals, i.e. first exposure signal A having an exposure period with a delay time being set to 0 with respect to the timing at which light source 11 receives the light emission signal and emits light, and first exposure signal B having an exposure period with a delay time being set to 3×To which is the sum of delay time 2×To of the third exposure signal and third exposure period To.

The length of each of the second and third exposure signal periods is set to To same as the length of the light emission signal period. The delay time of the second exposure signal is set to To which is the sum of delay time 0 of first exposure signal A and exposure period (To) of first exposure signal A. The delay time of the third exposure signal is set to 2×To which is the sum of delay time To of the second exposure signal and second exposure signal period To.

Accordingly, the exposure amount of background light is equal in the second and third exposure signal periods, and twice in the first exposure signal period.

The timing chart in FIG. 8 illustrates the case where delay Td due to the light path of reflected light from object OB with respect to the light emission signal timing (irradiation light) is less than To which is the sum of delay time 0 of first exposure signal A and exposure period To of first exposure signal A. In this case, exposure is performed so as to include all reflected light from object OB in the period that adds the exposure period of first exposure signal A and the second exposure signal period together. The exposure amount in the second exposure signal period is greater when delay Td of the reflected light from object OB with respect to the light emission signal timing is greater. In the third exposure signal period, exposure to only background light is performed. In this case, signal amount comparator 14 compares total exposure amount A0 according to the first exposure signal, total exposure amount A1 according to the second exposure signal, and total exposure amount A2 according to the third exposure signal, and determines as indicated in the following Expression 11.

[Math. 11]

$$A0 > 2 \times A2, A1 > A2 \quad \text{(Expression 11)}.$$

Signal amount comparator 14 notifies the determination result of Expression 11 to TOF calculator 15. TOF calculator 15 can calculate distance L according to the following Expression 12.

[Math. 12]

$$L = \frac{c \times T_o}{2} \times \frac{A1 - A2}{A0 - 2 \times A2 + A1 - A2}. \quad \text{(Expression 12)}$$

FIG. 9 illustrates the case where delay Td due to the light path of reflected light from object OB with respect to the light emission signal timing (irradiation light) is greater than or equal to To which is the sum of delay time 0 of first exposure signal A and exposure period To of first exposure signal A and is less than 2×To which is the sum of delay time To of the second exposure signal and second exposure signal period To. In this case, exposure is performed so as to include all reflected light from object OB in the period that adds the second exposure signal period and the third exposure signal period together. The exposure amount in the third exposure signal period is greater when delay Td of the reflected light from object OB with respect to the light emission signal timing is greater. In the first exposure signal period, exposure to only background light is performed.

In this case, signal amount comparator 14 compares total exposure amount A0 according to the first exposure signal, total exposure amount A1 according to the second exposure signal, and total exposure amount A2 according to the third exposure signal, and determines as indicated in the following Expression 13.

[Math. 13]

$$2 \times A2 \geq A0, 2 \times A1 > A0 \quad \text{(Expression 13)}.$$

Signal amount comparator 14 notifies the determination result of Expression 13 to TOF calculator 15. TOF calculator 15 can calculate distance L according to the following Expression 14.

[Math. 14]

$$L = \frac{c \times T_o}{2} \times \frac{A2 - A0/2}{A1 - A0/2 + A2 - A0/2} + \frac{c \times T_o}{2}. \quad \text{(Expression 14)}$$

FIG. 10 illustrates the case where delay Td due to the light path of reflected light from object OB with respect to the light emission signal timing (irradiation light) is greater than or equal to 2×To which is the sum of delay time To of the second exposure signal and second exposure signal period To. In this case, exposure is performed so as to include all reflected light from object OB in the period that adds the third exposure signal period and first exposure signal period A together. The exposure amount in the exposure period of first exposure signal B is greater when delay Td of the reflected light from object OB with respect to the light emission signal timing is greater. In the second exposure signal period, exposure to only background light is performed.

In this case, signal amount comparator 14 compares total exposure amount A0 according to the first exposure signal, total exposure amount A1 according to the second exposure signal, and total exposure amount A2 according to the third exposure signal, and determines as indicated in the following Expression 15.

[Math. 15]

$$A0 \geq 2 \times A1, A2 > A1 \quad \text{(Expression 15)}.$$

Signal amount comparator 14 notifies the determination result of Expression 15 to TOF calculator 15. TOF calculator 15 can calculate distance L according to the following Expression 16.

[Math. 16]

$$L = \frac{c \times T_o}{2} \times \frac{A0 - 2 \times A1}{A2 - A1 + A0 - 2 \times A1} + 2 \times \frac{c \times T_o}{2}. \quad \text{(Expression 16)}$$

As described above, all of a plurality of different signal accumulators are used to accumulate signals corresponding to exposure in exposure periods that differ in the exposure signal timing. Here, "exposure period" is a period of exposure to reflected light from object OB with respect to the light emission signal timing. In addition, at least one same signal accumulator from among the signal accumulators accumulates a signal by exposure at a plurality of different timings with respect to the light emission signal. By changing the expression for TOF calculation depending on the result of comparing the magnitude relationship in signal amount between the plurality of different signal accumulators, the exposure period is further increased while removing background light, without increasing the number of signal accumulators. Moreover, the distance measurement range (limit) is not limited to c×To/2, but widened three times to 3×(c×To/2). Hence, the distance measurement range can be further widened to at least one of the farther side and the closer side by setting the first delay time, without increasing pulse width To of the light source. A distance-measuring imaging device with high accuracy and a wide distance measurement range can thus be achieved.

(Variation 1 of Embodiment 2)

Figure 11:
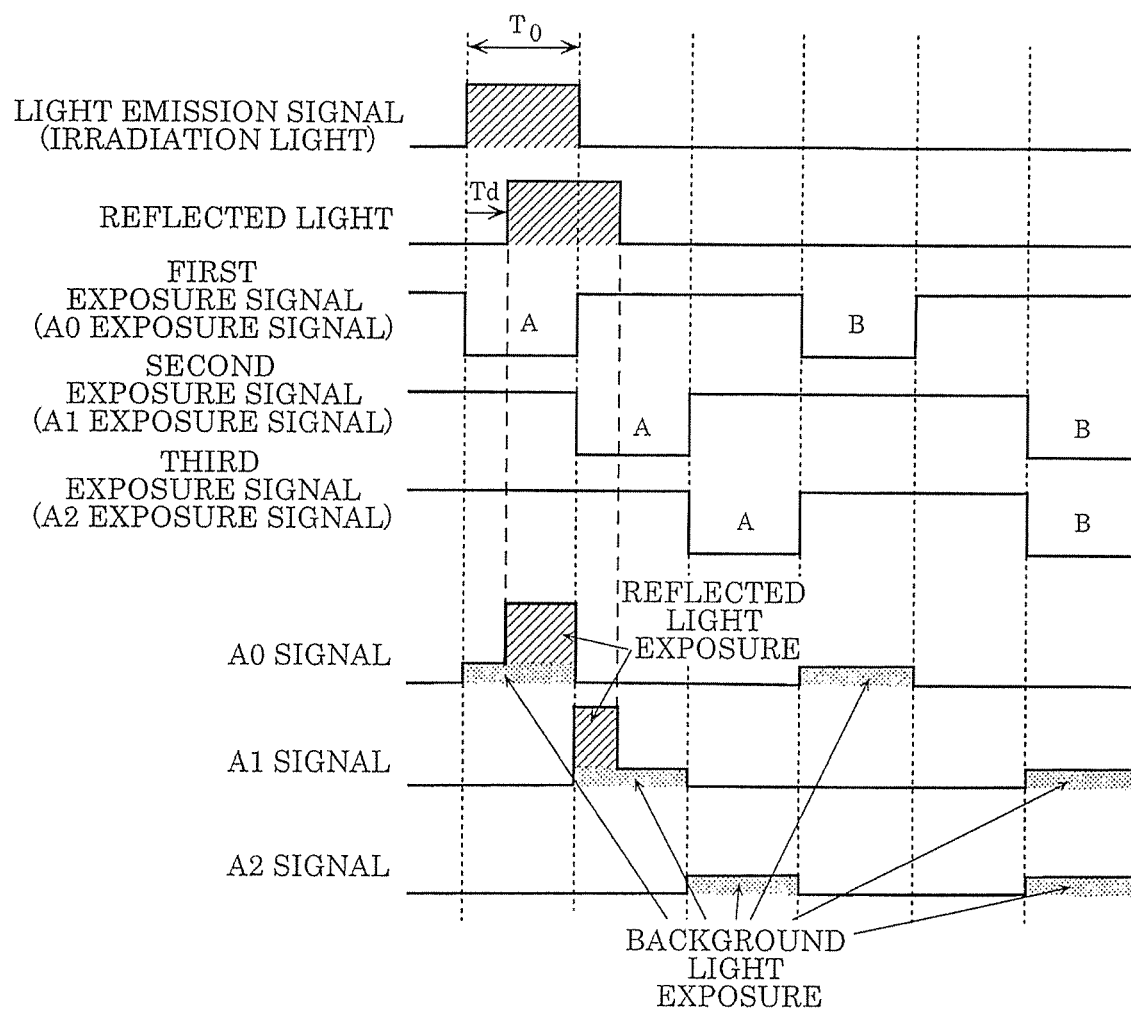
FIG. 11 is a timing chart of a light emission signal and an exposure signal in a distance-measuring imaging device according to Variation 1 of Embodiment 2.
Figure 12:
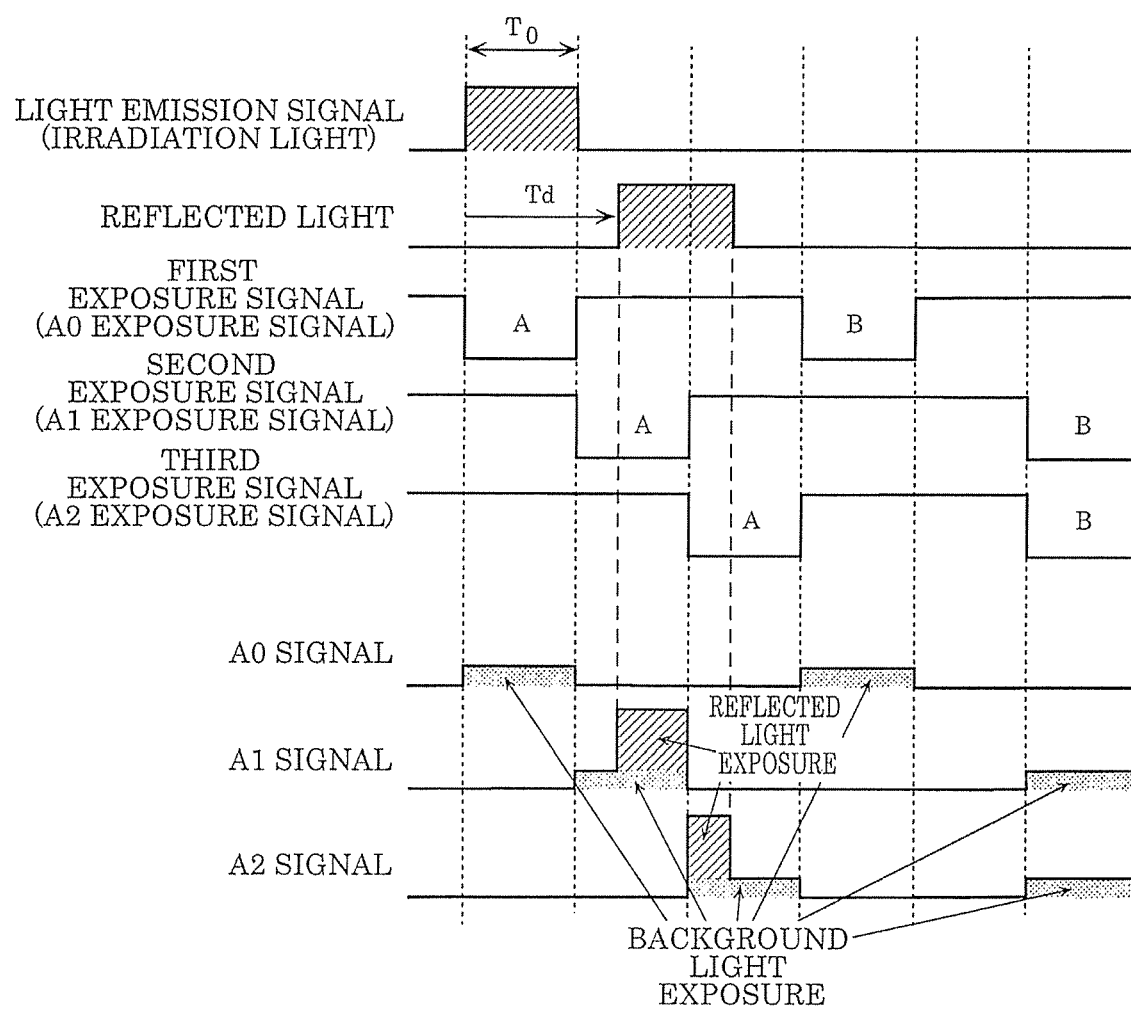
FIG. 12 is a timing chart of a light emission signal and an exposure signal in the distance-measuring imaging device according to Variation 1 of Embodiment 2.
Figure 13:
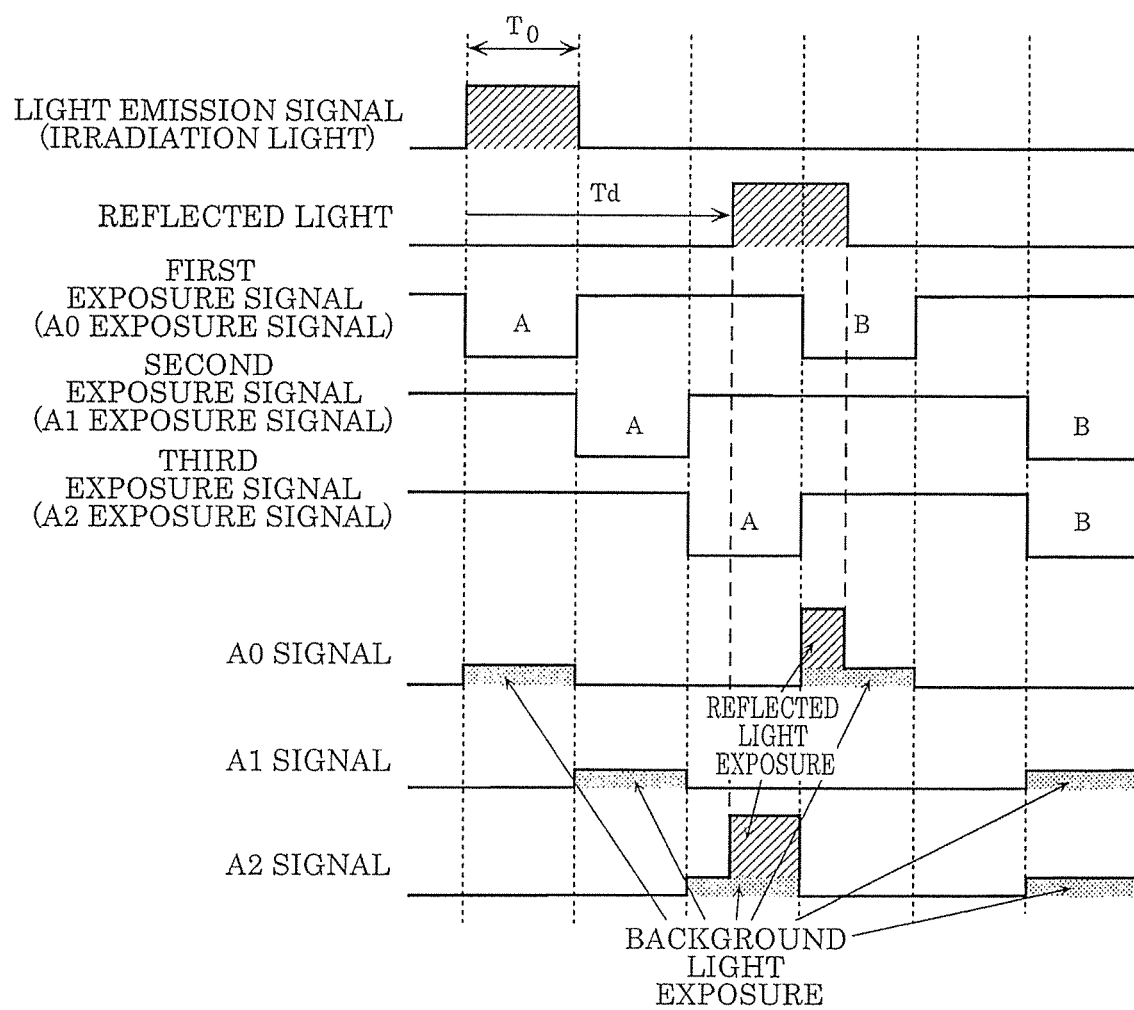
FIG. 13 is a timing chart of a light emission signal and an exposure signal in the distance-measuring imaging device according to Variation 1 of Embodiment 2.

FIGS. 11, 12, and 13 are each a timing chart of the light emission signal and the exposure signal in distance-measuring imaging device 1 according to Variation 1 of Embodiment 2. In detail, the drawings illustrate an example of the timing relationship between the light emission signal and the exposure signal generated by drive controller 13. In particular, the drawings each illustrate the timings of the light emission signal and exposure signal on the same paper surface, to ease the understanding of the relationship between a plurality of exposure periods that differ in the timing of the exposure signal for receiving reflected light. This embodiment describes an example where the number of different signal accumulators for accumulating signals detected in the same pixel in solid-state imager 12 is 3.

Drive controller 13 outputs the first, second, and third exposure signals that differ in the timing at which solid-state imager 12 receives reflected light from object OB with respect to the light emission signal.

In this embodiment, the length of the exposure signal period of the first exposure signal is set to To same as the length of the light emission signal period. The first exposure signal is composed of two exposure signals, i.e. first exposure signal A having an exposure period with a delay time being set to 0 with respect to the timing at which light source 11 receives the light emission signal and emits light, and first exposure signal B having an exposure period with a delay time being set to 3×To which is the sum of delay time 2×To of third exposure signal A and exposure period To of third exposure signal A.

The length of the exposure signal period of the second exposure signal is set to To same as the length of the light emission signal period. The second exposure signal is composed of two exposure signals, i.e. second exposure signal A and second exposure signal B. Second exposure signal A has an exposure period with a delay time being set to To which is the sum of delay time 0 of first exposure signal A and exposure period To of first exposure signal A. Second exposure signal B has an exposure period with a delay time being set to be greater than 4×To which is the sum of delay time 3×To of first exposure signal B and exposure period To of first exposure signal B.

The length of the exposure signal period of the third exposure signal is set to To same as the length of the light emission signal period. The third exposure signal is composed of two exposure signals, i.e. third exposure signal A and third exposure signal B. Third exposure signal A has an exposure period with a delay time being set to 2×To which is the sum of delay time To of second exposure signal A and exposure period To of second exposure signal A. Third exposure signal B has an exposure period with a delay time being set to be greater than 4×To which is the sum of delay time 3×To of first exposure signal B and exposure period To of first exposure signal B.

Accordingly, the exposure amount of background light is equal in the first, second, and third exposure signal periods.

The timing chart in FIG. 11 illustrates the case where delay Td due to the light path of reflected light from object OB with respect to the light emission signal timing (irradiation light) is less than To which is the sum of delay time 0 of first exposure signal A and exposure period To of first exposure signal A. In this case, exposure is performed so as to include all reflected light from object OB in the period that adds the exposure period of first exposure signal A and the exposure period of second exposure signal A together. The exposure amount in the exposure period of second exposure signal A is greater when delay Td of the reflected light from object OB with respect to the light emission signal timing is greater. In the third exposure signal period, exposure to only background light is performed.

In this case, signal amount comparator 14 compares total exposure amount A0 according to the first exposure signal, total exposure amount A1 according to the second exposure signal, and total exposure amount A2 according to the third exposure signal, and determines as indicated in the following Expression 17.
[Math. 17]

$$A0 > A2, A1 > A2 \quad \text{(Expression 17)}.$$

Signal amount comparator 14 notifies the determination result of Expression 17 to TOF calculator 15. TOF calculator 15 can calculate distance L according to the following Expression 18.

[Math. 18]

$$L = \frac{c \times To}{2} \times \frac{A1 - A2}{A0 - A2 + A1 - A2}. \quad \text{(Expression 18)}$$

FIG. 12 illustrates the case where delay Td due to the light path of reflected light from object OB with respect to the light emission signal timing (irradiation light) is greater than or equal to To which is the sum of delay time 0 of first exposure signal A and exposure period To of first exposure signal A and is less than 2×To which is the sum of delay time To of second exposure signal A and exposure period To of second exposure signal A. In this case, exposure is performed so as to include all reflected light from object OB in the period that adds the exposure period of second exposure signal A and the exposure period of third exposure signal A together. The exposure amount in the exposure period of third exposure signal A is greater when delay Td of the reflected light from object OB with respect to the light emission signal timing is greater. In the first exposure signal period, exposure to only background light is performed. In this case, signal amount comparator 14 compares total exposure amount A0 according to the first exposure signal, total exposure amount A1 according to the second exposure signal, and total exposure amount A2 according to the third exposure signal, and determines as indicated in the following Expression 19.
[Math. 19]

$$A2 \geq A0, A1 > A0 \quad \text{(Expression 19)}.$$

Signal amount comparator 14 notifies the determination result of Expression 19 to TOF calculator 15. TOF calculator 15 can calculate distance L according to the following Expression 20.

[Math. 20]

$$L = \frac{c \times To}{2} \times \frac{A2 - A0}{A1 - A0 + A2 - A0} + \frac{c \times To}{2}. \quad \text{(Expression 20)}$$

FIG. 13 illustrates the case where delay Td due to the light path of reflected light from object OB with respect to the light emission signal timing (irradiation light) is greater than or equal to 2×To which is the sum of delay time To of the second exposure signal and second exposure signal period To. In this case, exposure is performed so as to include all reflected light from object OB in the period that adds the exposure period of third exposure signal A and the exposure period of first exposure signal B together. The exposure amount in the exposure period of first exposure signal B is greater when delay Td of the reflected light from object OB with respect to the light emission signal timing is greater. In the second exposure signal period, exposure to only background light is performed.

In this case, signal amount comparator 14 compares total exposure amount A0 according to the first exposure signal, total exposure amount A1 according to the second exposure signal, and total exposure amount A2 according to the third exposure signal, and determines as indicated in the following Expression 21.
[Math. 21]

$$A0 \geq A1, A2 > A1 \quad \text{(Expression 21)}.$$

Signal amount comparator 14 notifies the determination result of Expression 21 to TOF calculator 15. TOF calculator 15 can calculate distance L according to the following Expression 22.

[Math. 22]

$$L = \frac{c \times To}{2} \times \frac{A0 - A1}{A2 - A1 + A0 - A1} + 2 \times \frac{c \times To}{2}. \quad \text{(Expression 22)}$$

As described above, all of a plurality of different signal accumulators are used to accumulate signals corresponding to exposure in exposure periods that differ in the exposure signal timing. Here, "exposure period" is a period of exposure to reflected light from object OB with respect to the light emission signal timing. In addition, in all of the signal accumulators, the same signal accumulator accumulates a signal by exposure at a plurality of different timings with respect to the light emission signal so that the exposure amount of background light is equal. This contributes to easier and more accurate comparison of the magnitude relationship in signal amount between the plurality of different signal accumulators. By changing the expression for TOF calculation depending on the result of the comparison, the exposure period is further increased while removing background light, without increasing the number of signal accumulators. Moreover, the distance measurement range (limit) is not limited to c×To/2, but widened three times to 3×(c×To/2). Hence, the distance measurement range can be further widened to at least one of the farther side and the closer side by setting the first delay time, without increasing pulse width To of the light source. A distance-measuring imaging device with high accuracy and a wide distance measurement range can thus be achieved.

(Variation 2 of Embodiment 2)

Figure 14:
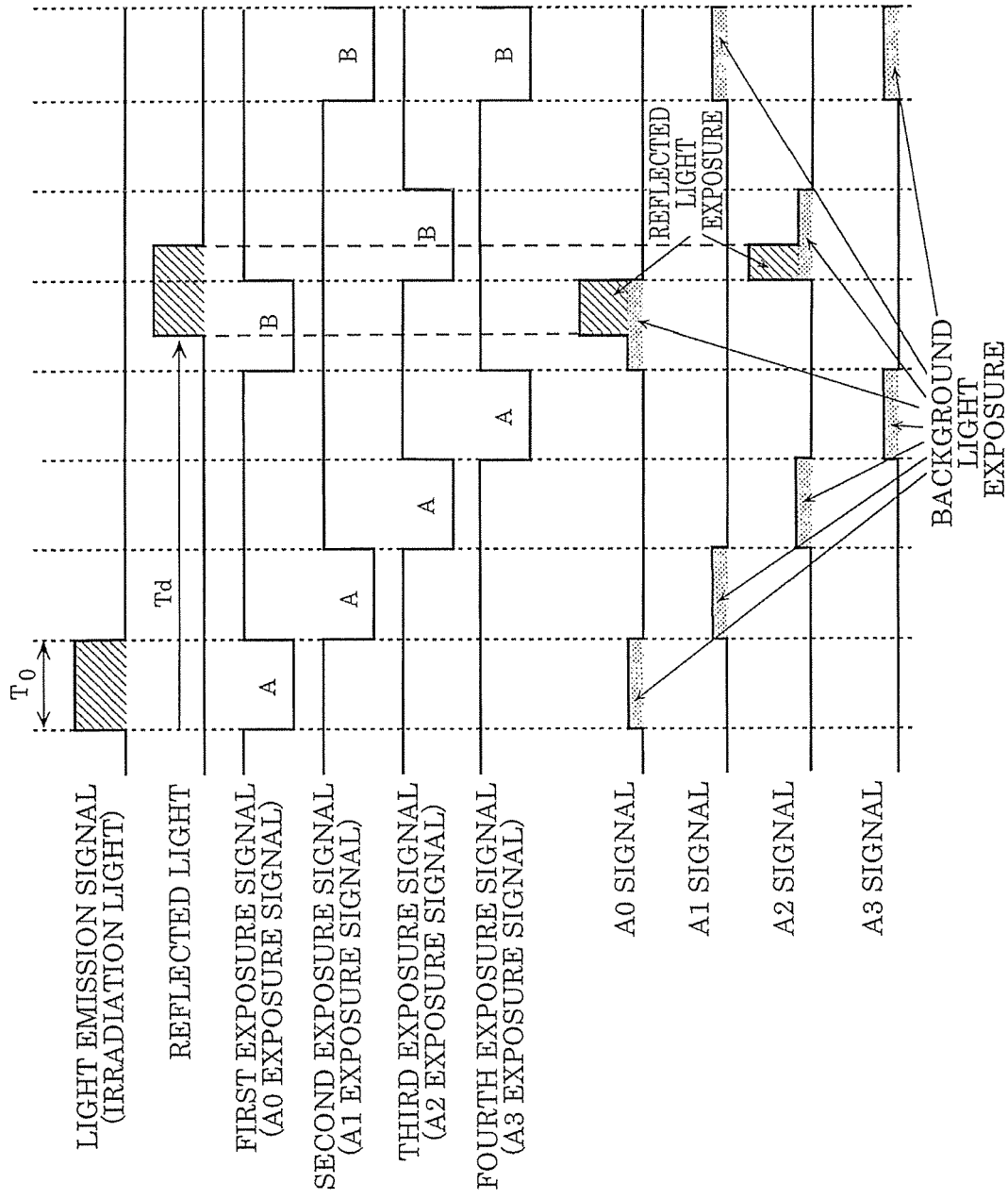
FIG. 14 is a timing chart of a light emission signal and an exposure signal in a distance-measuring imaging device according to Variation 2 of Embodiment 2.

FIG. 14 is a timing chart of the light emission signal and the exposure signal in distance-measuring imaging device 1 according to Variation 2 of Embodiment 2. In detail, the drawings illustrate an example of the timing relationship between the light emission signal and the exposure signal generated by drive controller 13. In particular, the drawings each illustrate the timings of the light emission signal and exposure signal on the same paper surface, to ease the understanding of the relationship between a plurality of exposure periods that differ in the timing of the exposure signal for receiving reflected light. This embodiment describes an example where the number of different signal accumulators for accumulating signals detected in the same pixel in solid-state imager 12 is 4.

Drive controller 13 outputs the first, second, third, and fourth exposure signals that differ in the timing at which solid-state imager 12 receives reflected light from object OB with respect to the light emission signal.

In this embodiment, the length of each exposure signal period of the first exposure signal is set to To same as the length of the light emission signal period. The first exposure signal is composed of two exposure signals, i.e. first exposure signal A having an exposure period with a delay time being set to 0 with respect to the timing at which light source 11 receives the light emission signal and emits light, and first exposure signal B having an exposure period with a delay time being set to 4×To which is the sum of delay time 3×To of fourth exposure signal A and exposure period To of fourth exposure signal A.

The length of each exposure signal period of the second exposure signal is set to To same as the length of the light emission signal period. The second exposure signal is composed of two exposure signals, i.e. second exposure signal A and second exposure signal B. Second exposure signal A has an exposure period with a delay time being set to To which is the sum of delay time 0 of first exposure signal A and exposure period To of first exposure signal A. Second exposure signal B has an exposure period with a delay time being set to be greater than 6×To which is the sum of delay time 5×To of third exposure signal B and exposure period To of third exposure signal B.

The length of each exposure signal period of the third exposure signal is set to To same as the length of the light emission signal period. The third exposure signal is composed of two exposure signals, i.e. third exposure signal A and third exposure signal B. Third exposure signal A has an exposure period with a delay time being set to 2×To which is the sum of delay time To of second exposure signal A and exposure period To of second exposure signal A. Third exposure signal B has an exposure period with a delay time being set to 5×To which is the sum of delay time 4×To of first exposure signal B and exposure period To of first exposure signal B.

The length of each exposure signal period of the fourth exposure signal is set to To same as the length of the light emission signal period. The fourth exposure signal is composed of two exposure signals, i.e. fourth exposure signal A and fourth exposure signal B. Fourth exposure signal A has an exposure period with a delay time being set to 3×To which is the sum of delay time 2×To of third exposure signal A and exposure period To of third exposure signal A. Fourth exposure signal B has an exposure period with a delay time being set to be greater than 6×To which is the sum of delay time 5×To of third exposure signal B and exposure period To of third exposure signal B.

Accordingly, the exposure amount of background light is equal in the first, second, third, and fourth exposure signal periods.

Detailed operation is described below. In the case where delay Td due to the light path of reflected light from object OB with respect to the light emission signal timing (irradiation light) is less than To which is the sum of delay time 0 of first exposure signal A and exposure period To of first exposure signal A, exposure is performed so as to include all reflected light from object OB in the period that adds the exposure period of first exposure signal A and the exposure period of second exposure signal A together. The exposure amount in the second exposure signal A is greater when delay Td of the reflected light from object OB with respect to the light emission signal timing is greater. In the third exposure signal period and the fourth exposure signal period, exposure to only background light is performed.

In this case, signal amount comparator 14 compares total exposure amount A0 according to the first exposure signal, total exposure amount A1 according to the second exposure signal, total exposure amount A2 according to the third exposure signal, and total exposure amount A3 according to the fourth exposure signal, and determines as indicated in the following Expression 23.

[Math. 23]

$$A0 > A2, A1 > A2, A0 > A3, A1 > A3 \qquad \text{(Expression 23)}.$$

Signal amount comparator 14 notifies the determination result of Expression 23 to TOF calculator 15. TOF calculator 15 can calculate distance L according to the following Expression 24. In this case, BG which is the exposure amount of background light may be any of A2, A3, and (A2+A3)/2.

[Math. 24]

$$L = \frac{c \times To}{2} \times \frac{A1 - BG}{A0 - BG + A1 - BG}. \qquad \text{(Expression 24)}$$

In the case where delay Td due to the light path of reflected light from object OB with respect to the light emission signal timing (irradiation light) is greater than or equal to To which is the sum of delay time 0 of first exposure signal A and exposure period To of first exposure signal A and is less than 2×To which is the sum of delay time To of second exposure signal A and exposure period To of second exposure signal A, exposure is performed so as to include all reflected light from object OB in the period that adds the exposure period of second exposure signal A and the exposure period of third exposure signal A together. The exposure amount in the exposure period of third exposure signal A is greater when delay Td of the reflected light from object OB with respect to the light emission signal timing is greater. In the first exposure signal period and the fourth exposure signal period, exposure to only background light is performed.

In this case, signal amount comparator 14 compares total exposure amount A0 according to the first exposure signal, total exposure amount A1 according to the second exposure signal, total exposure amount A2 according to the third exposure signal, and total exposure amount A3 according to the fourth exposure signal, and determines as indicated in the following Expression 25.

[Math. 25]

$$A2 \geq A0, A1 > A0, A1 > A3, A2 > A3 \quad \text{(Expression 25)}.$$

Signal amount comparator 14 notifies the determination result of Expression 25 to TOF calculator 15. TOF calculator 15 can calculate distance L according to the following Expression 26. In this case, BG which is the exposure amount of background light may be any of A0, A3, and (A0+A3)/2.

[Math. 26]

$$L = \frac{c \times T_o}{2} \times \frac{A2 - BG}{A1 - BG + A2 - BG} + \frac{c \times T_o}{2}. \quad \text{(Expression 26)}$$

In the case where delay Td due to the light path of reflected light from object OB with respect to the light emission signal timing (irradiation light) is greater than or equal to 2×To which is the sum of delay time To of second exposure signal A and exposure period To of second exposure signal A and is less than 3×To which is the sum of delay time 2×To of third exposure signal A and exposure period To of third exposure signal A, exposure is performed so as to include all reflected light from object OB in the period that adds the exposure period of third exposure signal A and the exposure period of fourth exposure signal A together. The exposure amount in fourth exposure signal A is greater when delay Td of the reflected light from object OB with respect to the light emission signal timing is greater. In the first exposure signal period and the second exposure signal period, exposure to only background light is performed.

In this case, signal amount comparator 14 compares total exposure amount A0 according to the first exposure signal, total exposure amount A1 according to the second exposure signal, total exposure amount A2 according to the third exposure signal, and total exposure amount A3 according to the fourth exposure signal, and determines as indicated in the following Expression 27.

[Math. 27]

$$A2 > A0, A3 > A0, A3 \geq A1, A2 > A1 \quad \text{(Expression 27)}.$$

Signal amount comparator 14 notifies the determination result of Expression 27 to TOF calculator 15. TOF calculator 15 can calculate distance L according to the following Expression 28. In this case, BG which is the exposure amount of background light may be any of A0, A1, and (A0+A1)/2.

[Math. 28]

$$L = \frac{c \times T_o}{2} \times \frac{A3 - BG}{A2 - BG + A3 - BG} + 2 \times \frac{c \times T_o}{2}. \quad \text{(Expression 28)}$$

In the case where delay Td due to the light path of reflected light from object OB with respect to the light emission signal timing (irradiation light) is greater than or equal to 3×To which is the sum of delay time 2×To of third exposure signal A and exposure period To of third exposure signal A and is less than 4×To which is the sum of delay time 3×To of fourth exposure signal A and exposure period To of fourth exposure signal A, exposure is performed so as to include all reflected light from object OB in the period that adds the exposure period of fourth exposure signal A and the exposure period of first exposure signal B together. The exposure amount in the exposure period of first exposure signal B is greater when delay Td of the reflected light from object OB with respect to the light emission signal timing is greater. In the second exposure signal period and the third exposure signal period, exposure to only background light is performed.

In this case, signal amount comparator 14 compares total exposure amount A0 according to the first exposure signal, total exposure amount A1 according to the second exposure signal, total exposure amount A2 according to the third exposure signal, and total exposure amount A3 according to the fourth exposure signal, and determines as indicated in the following Expression 29.

[Math. 29]

$$A0 \geq A2, A3 > A2, A0 > A1, A3 > A1 \quad \text{(Expression 29)}.$$

Signal amount comparator 14 notifies the determination result of Expression 29 to TOF calculator 15. TOF calculator 15 can calculate distance L according to the following Expression 30. In this case, BG which is the exposure amount of background light may be any of A1, A2, and (A1+A2)/2.

[Math. 30]

$$L = \frac{c \times T_o}{2} \times \frac{A0 - BG}{A3 - BG + A0 - BG} + 3 \times \frac{c \times T_o}{2}. \quad \text{(Expression 30)}$$

In the case where delay Td due to the light path of reflected light from object OB with respect to the light emission signal timing (irradiation light) is greater than or equal to 4×To which is the sum of delay time 3×To of fourth exposure signal A and exposure period To of fourth exposure signal A, exposure is performed so as to include all reflected light from object OB in the period that adds the exposure period of first exposure signal B and the exposure period of third exposure signal B together. The exposure amount in the exposure period of third exposure signal B is greater when delay Td of the reflected light from object OB with respect to the light emission signal timing is greater. In the second exposure signal period and the fourth exposure signal period, exposure to only background light is performed. The timing chart in FIG. 14 illustrates this case.

In this case, signal amount comparator 14 compares total exposure amount A0 according to the first exposure signal, total exposure amount A1 according to the second exposure signal, total exposure amount A2 according to the third exposure signal, and total exposure amount A3 according to the fourth exposure signal, and determines as indicated in the following Expression 31.

[Math. 31]

$$A0 > A3, A2 \geq A3, A0 > A1, A2 > A1 \quad \text{(Expression 31)}.$$

Signal amount comparator 14 notifies the determination result of Expression 31 to TOF calculator 15. TOF calculator 15 can calculate distance L according to the following Expression 32. In this case, BG which is the exposure amount of background light may be any of A1, A3, and (A1+A3)/2.

[Math. 32]

$$L = \frac{c \times To}{2} \times \frac{A2 - BG}{A0 - BG + A2 - BG} + 4 \times \frac{c \times To}{2}. \quad \text{(Expression 32)}$$

As described above, all of a plurality of different signal accumulators are used to accumulate signals corresponding to exposure in exposure periods that differ in the exposure signal timing. Here, "exposure period" is a period of exposure to reflected light from object OB with respect to the light emission signal timing. In addition, in all of the signal accumulators, the same signal accumulator accumulates a signal by exposure at a plurality of different timings with respect to the light emission signal so that the exposure amount of background light is equal. This contributes to easier and more accurate comparison of the magnitude relationship in signal amount between the plurality of different signal accumulators. By changing the expression for TOF calculation depending on the result of the comparison, the exposure period is further increased while removing background light, without increasing the number of signal accumulators. The distance measurement range (limit) is therefore not limited to 2×(c×To/2) as in the case where one of the signal accumulators is used exclusively for exposure to background light, but widened 2.5 times to 5×(c×To/2). Hence, the distance measurement range can be further widened to at least one of the farther side and the closer side by setting the first delay time, without increasing pulse width To of the light source. A distance-measuring imaging device with high accuracy and a wide distance measurement range can thus be achieved.

Although the foregoing embodiments describe a distance-measuring imaging device, the structure of a distance-measuring imaging device according to the present disclosure is applicable not only to a distance-measuring imaging device that measures a distance according to distance information, but also to a physical amount detection device that detects any other type of physical amount (e.g. shape, temperature, radiodensity) accurately or an imaging device that renders imaging data accurately.

(Conclusion)

As described above with reference to drawings, distance-measuring imaging device 1 according to an embodiment of the present disclosure includes: drive controller 13 that generates a light emission signal for instructing light application and an exposure signal for instructing exposure to reflected light; light source 11 that applies light according to timing indicated by the light emission signal; solid-state imager 12 that performs, for an area including object OB, exposure to light according to timing indicated by the exposure signal, and generates raw data which is imaging information corresponding to an exposure amount of the exposure; signal amount comparator 14 that determines a magnitude relationship in signal amount in the raw data; and TOF calculator 15 that generates a distance signal indicating a distance to object OB based on a result of the determination of the magnitude relationship in signal amount by signal amount comparator 14, and outputs the distance signal. Solid-state imager 12 includes a plurality of different signal accumulation regions for accumulating signals detected in a same pixel. Each of the plurality of different signal accumulation regions accumulates a signal by exposure in an exposure period corresponding to a different timing of the exposure signal for instructing exposure to reflected light from object OB with respect to the timing of the light emission signal. Signal amount comparator 14 determines a magnitude relationship in signal amount between a plurality of signals accumulated in the plurality of different signal accumulation regions. TOF calculator 15 receives the raw data from solid-state imager 12 or signal amount comparator 14, and calculates the distance to object OB using an arithmetic expression selected depending on the result of the determination of the magnitude relationship in signal amount, to generate and output the distance signal.

With this, the plurality of different signal accumulation regions are all used to accumulate a signal by exposure in an exposure period corresponding to a different timing of the exposure signal for instructing exposure to reflected light from object OB with respect to the timing of the light emission signal, while enabling background light removal without using any signal accumulation region exclusively for background light. This increases the exposure period to increase the period during which reflected light can be captured. Hence, the distance measurement range can be widened to at least one of the farther side and the closer side, without increasing the pulse width of the light source.

Solid-state imager 12 may perform, for the area including object OB, exposure to light a plurality of times according to the timing indicated by the exposure signal, and generate raw data which is imaging information corresponding to a total exposure amount of the exposure performed the plurality of times.

With this, high distance measurement accuracy can be achieved with high S/N. Moreover, the light emission intensity can be reduced to reduce power consumption.

At least one same signal accumulation region from among the plurality of different signal accumulation regions may accumulate a plurality of signals by exposure at a plurality of different timings of the exposure signal with respect to the light emission signal.

With this, the exposure period is further increased to increase the period during which reflected light can be captured, without increasing the number of signal accumulation regions. Hence, the distance measurement range can be further widened to at least one of the farther side and the closer side, without increasing the pulse width of the light source.

Signal amount comparator 14 may include: noise remover 26 that removes noise from the raw data received from solid-state imager 12; signal separator 27 that separates, based on the magnitude relationship in signal amount between a plurality of signals accumulated in the plurality of different signal accumulation regions in the raw data that is received from noise remover 26 and from which the noise is removed, a plurality of signals involving the reflected light and a signal involving only the background light, and notifies the result of the determination of the magnitude relationship in signal amount to TOF calculator 25; background light remover 28 that subtracts the signal involving only the background light from the plurality of signals involving the reflected light received from signal separator 27, to remove a background light signal; and abnormal value determinator 29 that determines an abnormal value from the plurality of signals from which the background light signal is removed by background light remover 28, and notifies a result of the determination to TOF calculator 25.

With this, the magnitude in signal amount is compared between the signals from which noise has been removed. Consequently, a determination error can be prevented, and more accurate distance measurement can be achieved. Moreover, the signal amounts of the plurality of signals from which background light has been removed are subjected to determination. Accordingly, in the case where object OB is outside the measurement range, the signal amounts of all of the plurality of signals from which background light has been removed are found to be close to 0. This eases the determination of whether or not the object is outside the distance measurement range. More accurate distance measurement can thus be achieved.

The present disclosure can be implemented not only as a distance-measuring imaging device including these features, but also as a distance measuring method of the distance-measuring imaging device.

A distance measuring method of a distance-measuring imaging device according to the present disclosure is a method whereby: solid-state imager 12 accumulates a plurality of signals by exposure in exposure periods that differ in timing of an exposure signal with respect to timing of a light emission signal, respectively in a plurality of different signal accumulation regions for accumulating signals detected in a same pixel; signal amount comparator 14 determines a magnitude relationship in signal amount between the signals accumulated in the plurality of different signal accumulation regions; and TOF calculator 15 selects an arithmetic expression for calculating a distance to object OB depending on a result of the determination by signal amount comparator 14, and calculates the distance to object OB using the selected expression, to generate and output a distance signal.

With this, the plurality of different signal accumulation regions are all used to accumulate a signal by exposure in an exposure period corresponding to a different timing of the exposure signal for instructing exposure to reflected light from object OB with respect to the timing of the light emission signal, while enabling background light removal without using any signal accumulation region exclusively for background light. This increases the exposure period to increase the period during which reflected light can be captured. Hence, the distance measurement range can be widened to at least one of the farther side and the closer side, without increasing the pulse width of the light source.

The present disclosure can be implemented not only as a distance-measuring imaging device and a distance measuring method including these features, but also as a solid-state imaging device used in the distance-measuring imaging device as solid-state imager 12. A solid-state imaging device used in distance-measuring imaging device 1 that includes drive controller 13, light source 11, a solid-state imaging device as solid-state imager 12, signal amount comparator 14, and TOF calculator 15 described above is a solid-state imaging device wherein each of a plurality of different signal accumulation regions accumulates a signal by exposure in an exposure period that differs in timing of an exposure signal for instructing exposure to reflected light from object OB with respect to timing of a light emission signal.

With this, the plurality of different signal accumulation regions are all used to accumulate a signal by exposure in an exposure period corresponding to a different timing of the exposure signal for instructing exposure to reflected light from object OB with respect to the timing of the light emission signal, while enabling background light removal without using any signal accumulation region exclusively for background light. This increases the exposure period to increase the period during which reflected light can be captured. Hence, the distance measurement range can be widened to at least one of the farther side and the closer side, without increasing the pulse width of the light source.

The solid-state imaging device may be a CCD solid-state imaging element.

With this, a plurality of packets already provided in a vertical transfer portion can be used as regions for accumulating signals obtained in a plurality of different exposure periods. This makes it unnecessary to newly form signal accumulators. A photodiode can be made larger with the same area, with it being possible to increase saturation sensitivity and increase the maximum light reception amount. Highly accurate distance measurement can thus be achieved. In addition, a global reset, i.e. an operation of resetting a plurality of photodiodes at once, is possible. More accurate distance measurement can be achieved in this way.

Other Embodiments

Although a distance-measuring imaging device according to the present disclosure has been described by way of the foregoing embodiments, a distance-measuring imaging device according to the present disclosure is not limited to the foregoing embodiments. Other embodiments obtained by combining any structural elements in the foregoing embodiments, modifications obtained by applying various changes conceivable by a person skilled in the art to the foregoing embodiments without departing from the scope of the present disclosure, and various appliances including a distance-measuring imaging device according to the present disclosure are also included in the present disclosure.

For example, while a distance-measuring imaging device according to the present disclosure has been described using a time of flight (TOF) method of measuring a distance with use of a time of flight during which light travels to and from a measurement object from among a plurality of methods for detecting an object, the use of other methods of measuring a distance are also included in the present disclosure.

INDUSTRIAL APPLICABILITY

A distance-measuring imaging device according to the present disclosure is capable of highly accurate three-dimensional measurement of a measurement object regardless of surrounding environment, and so is useful, for example, for three-dimensional measurement of persons or buildings.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

What is claimed is:

1. A distance-measuring imaging device comprising:
   a light source that applies irradiation light a plurality of times according to timing indicated by a light emission signal;
   a solid-state imager that includes a solid-state imaging element that performs, for an area including an object, exposure to light a plurality of times according to timing indicated by an exposure signal, and generates a signal corresponding to a total exposure amount of the exposure, the solid-state imaging element including a plurality of signal accumulation regions for accumulating signal charges detected in a same pixel, and each of the plurality of signal accumulation regions not being used exclusively to accumulate a signal charge by exposure to reflected light from the object involving only background light different from the irradiation light, but being used to accumulate a signal charge by exposure according to the exposure signal that differs in timing with respect to the light emission signal;

a signal amount comparator that determines a magnitude relationship in signal amount based on the signal charges accumulated in the plurality of signal accumulation regions; and a distance calculator that calculates a distance to the object by selecting a calculation method, based on a result of the determination of the magnitude relationship in signal amount.

2. The distance-measuring imaging device according to claim 1, wherein the signal amount comparator includes a signal separator that separates a plurality of signals involving the reflected light and a signal involving only the background light, and notifies the result of the determination of the magnitude relationship in signal amount to the distance calculator.

3. The distance-measuring imaging device according to claim 1, wherein the signal amount comparator includes a background light remover that subtracts the signal involving only the background light from the plurality of signals involving the reflected light, to remove a background light signal.

4. The distance-measuring imaging device according to claim 3, wherein the signal amount comparator includes an abnormal value determinator that determines an abnormal value from the plurality of signals from which the background light signal is removed by the background light remover, and notifies a result of the determination to the distance calculator.

5. The distance-measuring imaging device according to claim 1, wherein a plurality of signal charges by exposure at a plurality of timings of the exposure signal with respect to the light emission signal are accumulated in at least one same signal accumulation region from among the plurality of signal accumulation regions.

6. The distance-measuring imaging device according to claim 1, wherein the signal amount comparator determines the magnitude relationship in signal amount between signals from which noise is removed.

7. The distance-measuring imaging device according to claim 1, comprising a drive controller that generates the light emission signal and a plurality of the exposure signals, wherein the drive controller generates at least a first exposure signal, a second exposure signal, and a third exposure signal that have a same exposure period and differ in exposure timing, and a second delay time which is a delay time of the second exposure signal with respect to the light emission signal is a sum of a first delay time which is a delay time of the first exposure signal with respect to the light emission signal and a first exposure period which is an exposure period of the first exposure signal.

8. The distance-measuring imaging device according to claim 7, wherein a third delay time which is a delay time of the third exposure signal with respect to the light emission signal is a sum of the second delay time and a second exposure period which is an exposure period of the second exposure signal.

9. The distance-measuring imaging device according to claim 8, wherein in the case where a delay of arrival timing of the reflected light with respect to the timing of the light emission signal is less than the sum of the first delay time and the first exposure period, the signal amount comparator compares total exposure amount A0 according to the first exposure signal and total exposure amount A2 according to the third exposure signal, and determines the magnitude relationship in signal amount as A0>A2.

10. The distance-measuring imaging device according to claim 8, wherein in the case where a delay of arrival timing of the reflected light with respect to the timing of the light emission signal is greater than or equal to the sum of the first delay time and the first exposure period, the signal amount comparator compares a total exposure amount A0 according to the first exposure signal and a total exposure amount A2 according to the third exposure signal, and determines the magnitude relationship in signal amount as A2≥A0.

11. A solid-state imaging element used in a distance-measuring imaging device that includes: a drive controller that generates a light emission signal and an exposure signal: a light source that applies irradiation light a plurality of times according to timing indicated by the light emission signal; a solid-state imager that includes a solid-state imaging element that performs, for an area including an object, exposure to light a plurality of times according to timing indicated by the exposure signal, and generates a signal corresponding to a total exposure amount of the exposure; a signal amount comparator that determines a magnitude relationship in signal amount based on a plurality of signal charges accumulated in a plurality of signal accumulation regions; and a distance calculator that calculates a distance to the object by selecting a calculation method, based on a result of the determination of the magnitude relationship in signal amount, the solid-state imaging element comprising the plurality of signal accumulation regions for accumulating signal charges detected in a same pixel, wherein each of the plurality of signal accumulation regions is not used exclusively to accumulate a signal charge by exposure to reflected light from the object involving only background light different from the irradiation light applied from the light source, but used to accumulate a signal charge by exposure according to the exposure signal from the drive controller, the exposure signal having a same exposure period and different in timing with respect to the light emission signal from the drive controller.

12. The solid-state imaging element according to claim 11, being a charge coupled device (CCD) solid-state imaging element.

13. The solid-state imaging element according to claim 11, wherein at least one of the plurality of signal accumulation regions accumulates the signal charges by exposure according to different timings indicated by exposure signals with respect to each of light emission signals.

\* \* \* \* \*